United States Patent
Yang et al.

(10) Patent No.: US 12,164,734 B2
(45) Date of Patent: Dec. 10, 2024

(54) TOUCH SENSING UNIT AND DISPLAY DEVICE INCLUDING THE SAME

(71) Applicant: Samsung Display Co., Ltd., Yongin-si (KR)

(72) Inventors: Sung Jin Yang, Cheonan-si (KR); Ki Cheol Kim, Yongin-si (KR); Sung Hee Kim, Cheonan-si (KR); Hyun Sik Park, Cheonan-si (KR); Chun Gi You, Asan-si (KR); Sung Ho Cho, Yongin-si (KR); Min Ho Chae, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/082,144

(22) Filed: Dec. 15, 2022

(65) Prior Publication Data

US 2023/0118970 A1   Apr. 20, 2023

Related U.S. Application Data

(60) Continuation of application No. 17/833,817, filed on Jun. 6, 2022, now Pat. No. 11,550,439, which is a
(Continued)

(30) Foreign Application Priority Data

Sep. 4, 2019  (KR) .................. 10-2019-0109502
Nov. 5, 2019  (KR) .................. 10-2019-0139935

(51) Int. Cl.
G06F 3/044   (2006.01)
G06F 3/041   (2006.01)
H10K 59/40   (2023.01)

(52) U.S. Cl.
CPC .......... G06F 3/0446 (2019.05); G06F 3/0412 (2013.01); *G06F 2203/04107* (2013.01); *H10K 59/40* (2023.02)

(58) Field of Classification Search
CPC . G06F 2203/04103; G06F 2203/04107; G06F 2203/04111; G06F 2203/04112; G06F 3/0412; G06F 3/0443; G06F 3/0446
See application file for complete search history.

(56) References Cited

U.S. PATENT DOCUMENTS

2011/0057893 A1   3/2011  Kim et al.
2012/0182230 A1   7/2012  Wang et al.
(Continued)

FOREIGN PATENT DOCUMENTS

KR   10-2011-0025374   3/2011
KR   10-2014-0129797   11/2014
(Continued)

OTHER PUBLICATIONS

Non-Final Office Action mailed Oct. 7, 2021, in U.S. Appl. No. 17/011,932.
(Continued)

*Primary Examiner* — Robin J Mishler
(74) *Attorney, Agent, or Firm* — Lewis Roca Rothgerber Christie LLP

(57) ABSTRACT

A display device including a touch sensing unit including a first touch conductive layer, a first touch insulating layer disposed on the first touch conductive layer, and a second touch conductive layer disposed on the first touch insulating layer. The touch sensor area includes a first touch sensor area located at a center of the touch sensor area, and a second touch sensor area located between the first touch sensor area and the curved portion. The first touch conductive layer includes a touch connection electrode connecting adjacent first touch electrodes, and a plurality of capacitance (cap) compensation patterns arranged in the second touch sensor area. The plurality of cap compensation patterns includes a first cap compensation pattern electrically connected to the adjacent first touch electrode and a second cap compensation
(Continued)

pattern electrically connected to the adjacent second touch electrode.

8 Claims, 34 Drawing Sheets

Related U.S. Application Data division of application No. 17/011,932, filed on Sep. 3, 2020, now Pat. No. 11,354,002.

(56) References Cited

U.S. PATENT DOCUMENTS

| | | |
|---|---|---|
| 2015/0084922 A1 | 3/2015 | Park et al. |
| 2016/0202515 A1* | 7/2016 | Watanabe ............ G02F 1/1339 349/190 |
| 2018/0124898 A1* | 5/2018 | Kwon .................... H05B 45/60 |
| 2018/0348911 A1 | 12/2018 | Lee et al. |
| 2018/0348929 A1 | 12/2018 | Rhe et al. |
| 2019/0102017 A1 | 4/2019 | Kim et al. |

FOREIGN PATENT DOCUMENTS

| | | |
|---|---|---|
| KR | 10-2015-0001016 | 1/2015 |
| KR | 10-2016-0091178 | 8/2016 |

OTHER PUBLICATIONS

Notice of Allowance issued Feb. 9, 2022, in U.S. Appl. No. 17/011,932.

Notice of Allowance issued Sep. 7, 2022, in U.S. Appl. No. 17/833,817.

\* cited by examiner

Cm: Cm1~Cm4

TSA_1: TSA1~TSA4

TSA_2: TSA1, TSA2, TSA5

TOUCH SENSING UNIT AND DISPLAY DEVICE INCLUDING THE SAME

CROSS-REFERENCE TO RELATED APPLICATION

This application is a Continuation of U.S. patent application Ser. No. 17/833,817, filed Jun. 6, 2022, which is a divisional of U.S. application Ser. No. 17/011,932, filed on Sep. 3, 2020, now issued as U.S. Pat. No. 11,354,002, which claims priority from and the benefit of Korean Patent Application No. 10-2019-0109502, filed on Sep. 4, 2019, and Korean Patent Application No. 10-2019-0139935, filed on Nov. 5, 2019, which are hereby incorporated by reference for all purposes as if fully set forth herein.

BACKGROUND

Field

Exemplary embodiments of the invention relate to a touch sensing unit and a display device including the same.

Discussion of the Background

A display device for displaying an image is used for various electronic appliances for providing an image to a user, such as smart phones, tablet PCs, digital cameras, notebook computers, navigators, and televisions. The display device includes a display panel for generating and displaying an image and various input devices.

Recently, in the fields of smart phones and tablet PCs, a touch sensing unit recognizing a touch input has widely been used in a display device. The touch sensing unit determines whether a user inputs a touch and calculates a corresponding position as touch input coordinates.

The touch sensing unit includes first touch electrodes electrically connected in a first direction, and second touch electrodes electrically connected in a second direction intersecting the first direction.

As the bezel area of a display device is reduced and the edges of a display screen has a rounded shape (corner round shape), the edges of a touch sensing unit corresponding to the edges of the display screen may also have a round shape (corner round shape). However, when applying the above corner round shape, a decrease in area of the first and second touch electrodes at the bottom edge of the touch sensing unit may be greater than a decrease in area of the first and second touch electrodes at the top edge of the touch sensing unit. In this case, a decrease in charge rate may occur due to a decrease in sensing area at the bottom edge of the touch sensing unit, which may lead to a decrease in touch detection power.

The above information disclosed in this Background section is only for understanding of the background of the inventive concepts, and, therefore, it may contain information that does not constitute prior art.

SUMMARY

Exemplary embodiments of the invention provide a touch sensing unit capable of preventing a decrease in touch detection power due to a decrease in sensing area of the touch sensing unit.

Exemplary embodiments of the invention also provide a display device including the touch sensing unit capable of preventing a decrease in touch detection power due to a decrease in sensing area of the touch sensing unit.

Additional features of the inventive concepts will be set forth in the description which follows, and in part will be apparent from the description, or may be learned by practice of the inventive concepts.

An exemplary embodiment of the invention provides a display device including a display unit; and a touch sensing unit disposed on the display unit and having edges each having a curved portion. The touch sensing unit includes a touch sensor area and a touch peripheral area located around the touch sensor area. The touch sensing unit further includes a first touch conductive layer, a first touch insulating layer disposed on the first touch conductive layer, and a second touch conductive layer disposed on the first touch insulating layer. The touch sensor area includes a first touch sensor area located at a center of the touch sensor area, and a second touch sensor area located between the first touch sensor area and the curved portion. The second touch conductive layer includes a plurality of first touch electrodes arranged in a first direction and a plurality of second touch electrodes arranged in a second direction intersecting the first direction. The first touch conductive layer includes a touch connection electrode connecting the adjacent first touch electrodes, and a plurality of capacitance (cap) compensation patterns arranged in the second touch sensor area. The plurality of cap compensation patterns includes a first cap compensation pattern electrically connected to the adjacent first touch electrode and a second cap compensation pattern electrically connected to the adjacent second touch electrode.

The curved portion may include a first curved portion located at a lower end of the touch sensing unit, and each of the first touch electrode and the second touch electrode disposed in the second touch sensor area may have a shape cut by the first curved portion.

The first cap compensation pattern may be electrically connected to the first touch electrode disposed in the second touch sensor area through a first contact hole of the first touch insulating layer, the second cap compensation pattern may be electrically connected to the second touch electrode disposed in the second touch sensor area through a second contact hole of the first touch insulating layer, and the first cap compensation pattern and the second cap compensation pattern may be insulated from each other.

The first cap compensation pattern may include at least one first extension pattern, and the second cap compensation pattern may include at least one second extension pattern.

The at least one first extension pattern may be a plurality of first extension patterns, the at least one second extension pattern may be a plurality of second extension patterns, and the plurality of first extension patterns and the plurality of second extension patterns may be arranged alternately to each other.

The first cap compensation pattern and the second cap compensation pattern may be disposed to overlap the first touch electrode and the second touch electrode disposed in the second sensor area in a thickness direction, respectively.

The curved portion may include a second curved portion located at an upper end of the touch sensing unit, each of the first touch electrode and the second touch electrode, disposed adjacent to the second curved portion, may have a shape cut by the second curved portion, and the area of the first touch electrode disposed in the second touch sensor area may be smaller than the area of the first touch electrode adjacent to the second curved portion.

The area of the second touch electrode disposed in the second touch sensor area may be smaller than the area of the second touch electrode adjacent to the second curved portion.

The first touch conductive layer may include an opaque conductive material, and the second touch conductive layer may include a transparent conductive material.

The display unit may include a display substrate, a thin film transistor layer disposed on the display substrate, an organic light emitting layer disposed on the thin film transistor layer, and an thin film encapsulation layer disposed on the organic light emitting layer and encapsulating the organic light emitting layer, and the first touch conductive layer may be disposed directly on the thin film encapsulation layer.

Each of the first touch electrode and the second touch electrode may have a mesh form.

Another exemplary embodiment of the invention provides a display device including a display unit; and a touch sensing unit disposed on the display unit and having edges each having a curved portion. The touch sensing unit includes a touch sensor area and a touch peripheral area located around the touch sensor area. The touch sensing unit further includes a first touch conductive layer, a first touch insulating layer disposed on the first touch conductive layer, and a second touch conductive layer disposed on the first touch insulating layer. The touch sensor area includes a first touch sensor area located at a center of the touch sensor area, and a second touch sensor area located between the first touch sensor area and the curved portion. The second touch conductive layer includes a plurality of first touch electrodes arranged in a first direction and a plurality of second touch electrodes arranged in a second direction intersecting the first direction. The first touch conductive layer includes a touch connection electrode connecting the adjacent first touch electrodes, a metal screening film pattern disposed on the second touch sensor area, and a plurality of cap compensation patterns arranged in the touch peripheral area. The plurality of cap compensation patterns includes a first cap compensation pattern electrically connected to the adjacent first touch electrode and a second cap compensation pattern electrically connected to the adjacent second touch electrode.

The metal screening film pattern may be electrically separated from the cap compensation pattern, the curved portion may include a first curved portion located at a lower end of the touch sensing unit, and the first touch electrode and the second touch electrode, disposed in the second touch sensor area, may have a shape cut by the first curved portion.

The first cap compensation pattern may be electrically connected to the first touch electrode disposed in the second touch sensor area through a first contact hole of the first touch insulating layer, the second cap compensation pattern may be electrically connected to the second touch electrode disposed in the second touch sensor area through a second contact hole of the first touch insulating layer, and the first cap compensation pattern and the second cap compensation pattern may be insulated from each other.

The first cap compensation pattern may include a plurality of first extension patterns and a first connection pattern connection the adjacent first extension patterns, and the second cap compensation pattern may include a plurality of second extension patterns and a second connection pattern connection the adjacent second extension patterns.

The plurality of first extension patterns and the plurality of second extension patterns may be arranged alternately to each other.

Another exemplary embodiment of the invention provides a display device including a display unit; a touch sensing unit disposed on the display unit; and a through pattern penetrating the display unit and the touch sensing unit. The touch sensing unit includes a first touch sensor area and a second touch sensor area located between the through pattern and the first touch sensor area in a plan view. The touch sensing unit includes a first touch conductive layer, a first touch insulating layer disposed on the first touch conductive layer, and a second touch conductive layer disposed on the first touch insulating layer. The second touch conductive layer includes a plurality of first touch electrodes arranged in a first direction, a plurality of second touch electrodes arranged in a second direction intersecting the first direction, and a first touch connection electrode connecting the adjacent second touch electrodes. The first touch conductive layer includes a second touch connection electrode connecting the adjacent first touch electrodes, and a plurality of cap compensation patterns arranged in the second touch sensor area. The plurality of cap compensation patterns includes a first cap compensation pattern electrically connected to the adjacent first touch electrode and a second cap compensation pattern electrically connected to the adjacent second touch electrode.

The through pattern may have a trench shape indented from edges of the display unit and the touch sensing unit.

The through pattern may include a through-hole penetrating the display unit and the touch sensing unit.

Each of the first touch electrode adjacent to the through-hole and the second touch electrode may have a shape cut by the second touch sensor area in a plan view, the first touch electrode adjacent to the through-hole may be electrically connected by the second touch connection electrode bypassing the through-hole in a plan view, and the second touch electrode may be electrically connected by the first touch connection electrode bypassing the through-hole in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
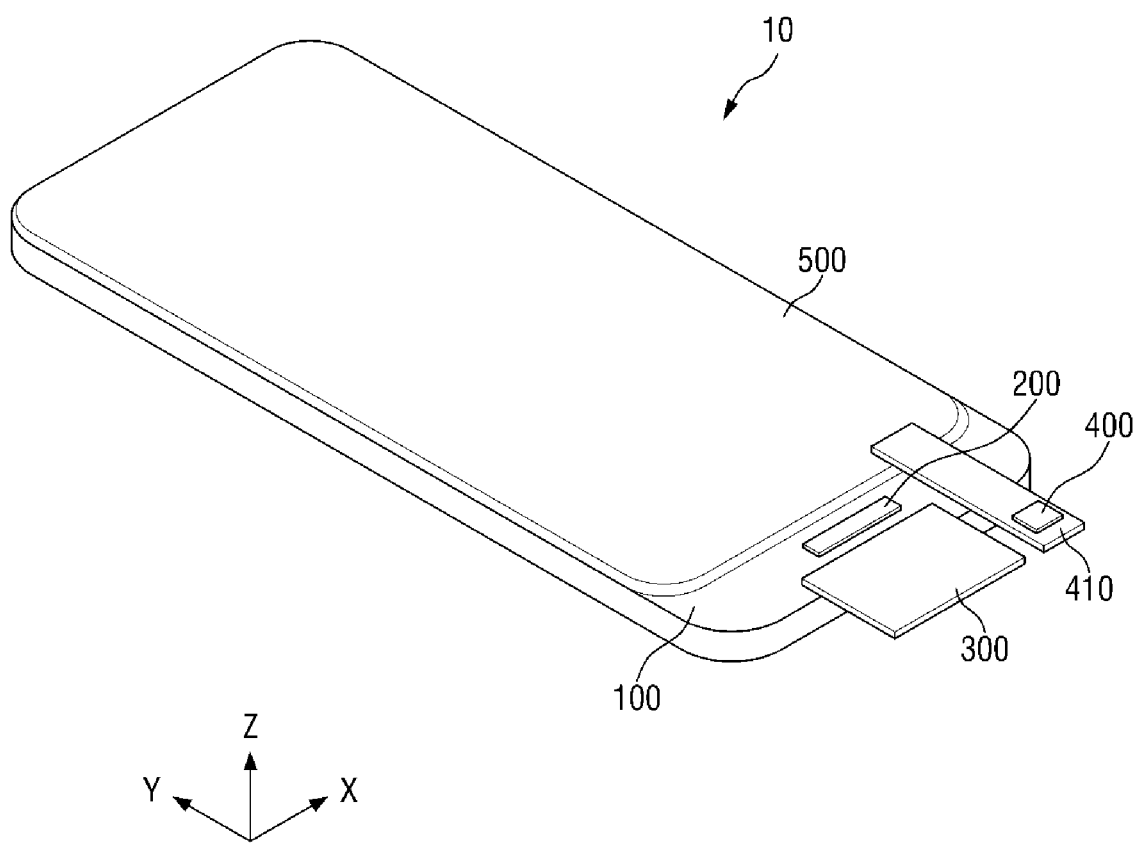
FIG. 1 is a perspective view of a display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

In this specification, the "on", "over", "top", "upper side", or "upper surface" refers to a direction in which a touch sensing unit 500 is disposed with respect to a display panel 100, that is, a Z-axis direction, and the "beneath", "under", "bottom", "lower side", or "lower surface" refers to a direction in which the display panel 100 is disposed with respect to the touch sensing unit 500, that is, a direction opposite to the Z-axis direction. Further, the "left", "right", "upper", and "lower" refer to directions when the display panel 100 is viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the attached drawings.

Figure 2:
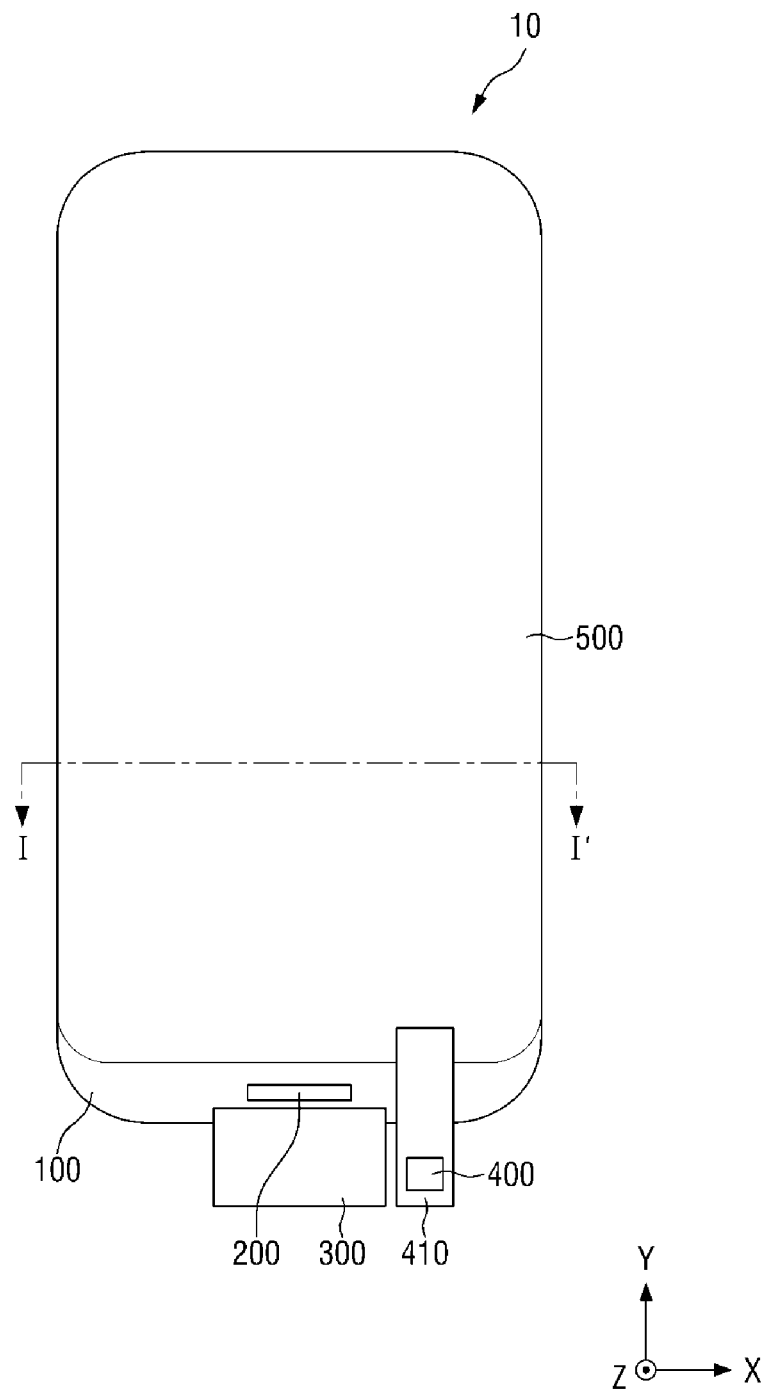
FIG. 2 is a plan view of a display device according to an exemplary embodiment of the invention.

FIG. 1 is a perspective view of a display device according to an exemplary embodiment, and FIG. 2 is a plan view of a display device according to an exemplary embodiment.

Referring to FIGS. 1 and 2, a display device 10 is a device for displaying a moving image or a still image. The display device 10 may be used as a display screen for various products such as televisions, notebooks, monitors, billboards, and internets of things as well as portable electronic appliances such as mobile phones, smart phones, tablet personal computers (PCs), smart watches, watch phones, mobile communication terminals, electronic notebooks, electronic books, portable multimedia players (PMPs), navigators, and ultra mobile PCS (UMPs). The display device 10 may be any one of an organic light emitting display device, a liquid crystal display device, a plasma display device, a field emission display device, an electrophoretic display device, an electrowetting display device, a quantum dot emission display device, and a micro LED display device. Hereinafter, the display device 10 will be described assuming that the display device 10 is an organic light emitting display device, but the inventive concepts are not limited thereto.

The display device 10 according to an exemplary embodiment may include a display panel 100, a display driving circuit 200, a display circuit board 300, a touch driving circuit 400, a touch circuit board 410, and a touch sensing unit 500.

The display panel 100 may have a rectangular planar shape having short sides in a first direction (X-axis direction) and long sides in a second direction (Y-axis direction) crossing the first direction (X-axis direction). The corner where the short side in the first direction (X-axis direction) meets the long side in the second direction (Y-axis direction) may be formed to have a round shape of a predetermined curvature or have a right angle shape. The planar shape of the display panel 100 is not limited to a rectangular shape, and may be formed in another polygonal shape, a circular shape, or an elliptical shape.

The display panel 100 may be formed to be flat, but the inventive concepts are not limited thereto. The display panel 100 may include a curved portion formed at left and right ends thereof. In this case, the curved portion may have a constant curvature or have a variable curvature. Further, the display panel 100 may be formed to be flexible such that it is bent, warped, folded or rolled.

The display panel 100 may include pixels disposed in a display area to display an image, and display electrode pads disposed in a non-display area around the display area. The display electrode pads may be formed on the display panel 100 at one edge of the display panel 100 to be electrically connected to the display circuit board 300. Details of the display panel 100 will be described later with reference to FIGS. 3 and 5.

The display driving circuit 200 outputs signals and voltages for driving the display panel 100. For example, the display driving circuit 200 may supply data voltages to data lines. Further, the display driving circuit 200 may supply a power supply voltage to a power supply line, and may supply scan control signals to a scan driver. The display driving circuit 200 may be formed as an integrated circuit (IC), and may be attached onto the display panel 100 by a chip on glass (COG) method, a chip on plastic (COP) method, or an ultrasonic bonding method. The display driving circuit 200 may be attached onto the display panel 100 exposed without being covered by the touch sensing unit 500. Alternatively, the display driving circuit 200 may be mounted on the display circuit board 300.

The display circuit board 300 may be attached onto the display electrode pads of the display panel 100 using an anisotropic conductive film. Thus, the lead lines of the display circuit board 300 may be electrically connected to the display electrode pads of the display panel 100. The display circuit board 300 may be a flexible printed circuit board, a printed circuit board, or a flexible film such as a chip on film.

The touch sensing unit 500 may be disposed on the display panel 100. The touch sensing unit 500 may have a rectangular planar shape having short sides in the first direction (X-axis direction) and long sides in the second direction (Y-axis direction). The corner where the short side in the first direction (X-axis direction) meets the long side in the second direction (Y-axis direction) may be formed to have a round shape of a predetermined curvature or have a right angle shape. The planar shape of the touch sensing unit 500 is not limited to a rectangular shape, and may be formed in another polygonal shape, a circular shape, or an elliptical shape. The planar shape of the touch sensing unit 500 may be similar to the planar shape of the display panel 100.

The touch sensing unit 500 may include curved portions formed at left and right ends thereof. In this case, the curved portion may have a constant curvature or have a variable curvature. The curved portions located over the touch sensing unit 500 in the second direction (Y-axis direction) may have smaller curvature radii than the curved portions located under the touch sensing unit 500 in the second direction (Y-axis direction). Since the curved portions located over the touch sensing unit 500 in the second direction (Y-axis direction) have different curvature radii from the curved portions located under the touch sensing unit 500 in the second direction (Y-axis direction), as will be described later, touch electrodes adjacent to the curved portions located over the touch sensing unit 500 in the second direction (Y-axis direction) may have different areas from touch electrodes adjacent to the curved portions located under the touch sensing unit 500 in the second direction (Y-axis direction).

Further, like the display panel 100, the touch sensing unit 500 may be formed to be flexible such that it may be bent, warped, folded, or rolled.

The touch sensing unit 500 may include touch electrodes disposed in a touch sensor area to detect a user's touch, and touch electrode pads disposed in a touch peripheral area around the touch sensor area. The touch electrode pads may be formed on the touch sensing unit 500 at one edge of the touch sensing unit 500 to be electrically connected to the touch circuit board 410.

Details of the touch sensing unit 500 will be described later with reference to FIGS. 3 and 5. Although it is illustrated in FIGS. 1 and 2 that the touch sensing unit 500 is a separate touch panel that is separated from the display panel 100, the inventive concepts are not limited thereto.

The touch circuit board 410 may be attached onto the touch electrode pads of the touch sensing unit 500 using an anisotropic conductive film. Thus, the lead lines of the touch circuit board 410 may be electrically connected to the touch electrode pads of the touch sensing unit 500. The touch circuit board 410 may be a flexible printed circuit board, a printed circuit board, or a flexible film such as a chip-on film.

The touch driving circuit 400 may be connected to the touch electrodes of the touch sensing unit 500. The touch driving circuit 400 applies touch driving signals to the touch electrodes of the touch sensing unit 500 and measures capacitance values of the touch electrodes. The touch driving signals may be signals having a plurality of driving pulses. The touch driving circuit 400 may not only determine whether a touch is input based on the capacitance values, but also calculate touch coordinates to which the touch is input. The touch driving circuit 400 may be formed as an integrated circuit (IC), and may be mounted on the touch circuit board 410.

Figure 3:
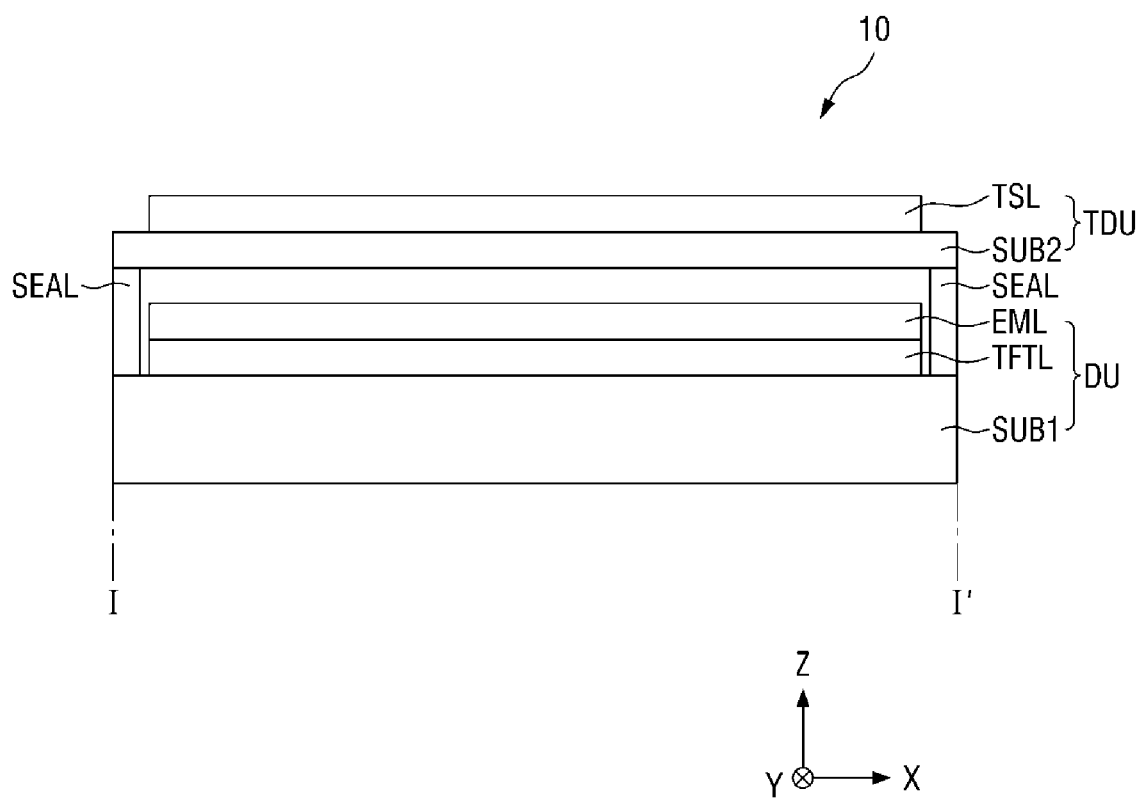
FIG. 3 is an example of a cross-sectional view taken along the line I-I' of FIG. 2.

FIG. 3 is an example of a cross-sectional view taken along the line I-I' of FIG. 2.

Referring to FIG. 3, the display device 10 may include a display unit DU, a touch sensing unit TDU, and an adhesive member SEAL for attaching the display unit DU to the touch sensing unit TDU.

The display unit DU may include a first substrate SUB1, a thin film transistor layer TFTL, and a light emitting element layer EML.

The first substrate SUB1 may be a rigid substrate, or may be a flexible substrate capable of bending, folding, rolling, or the like. The first substrate SUB1 may include an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. Alternatively, the first substrate SUB1 may include a metal material.

Figure 4:
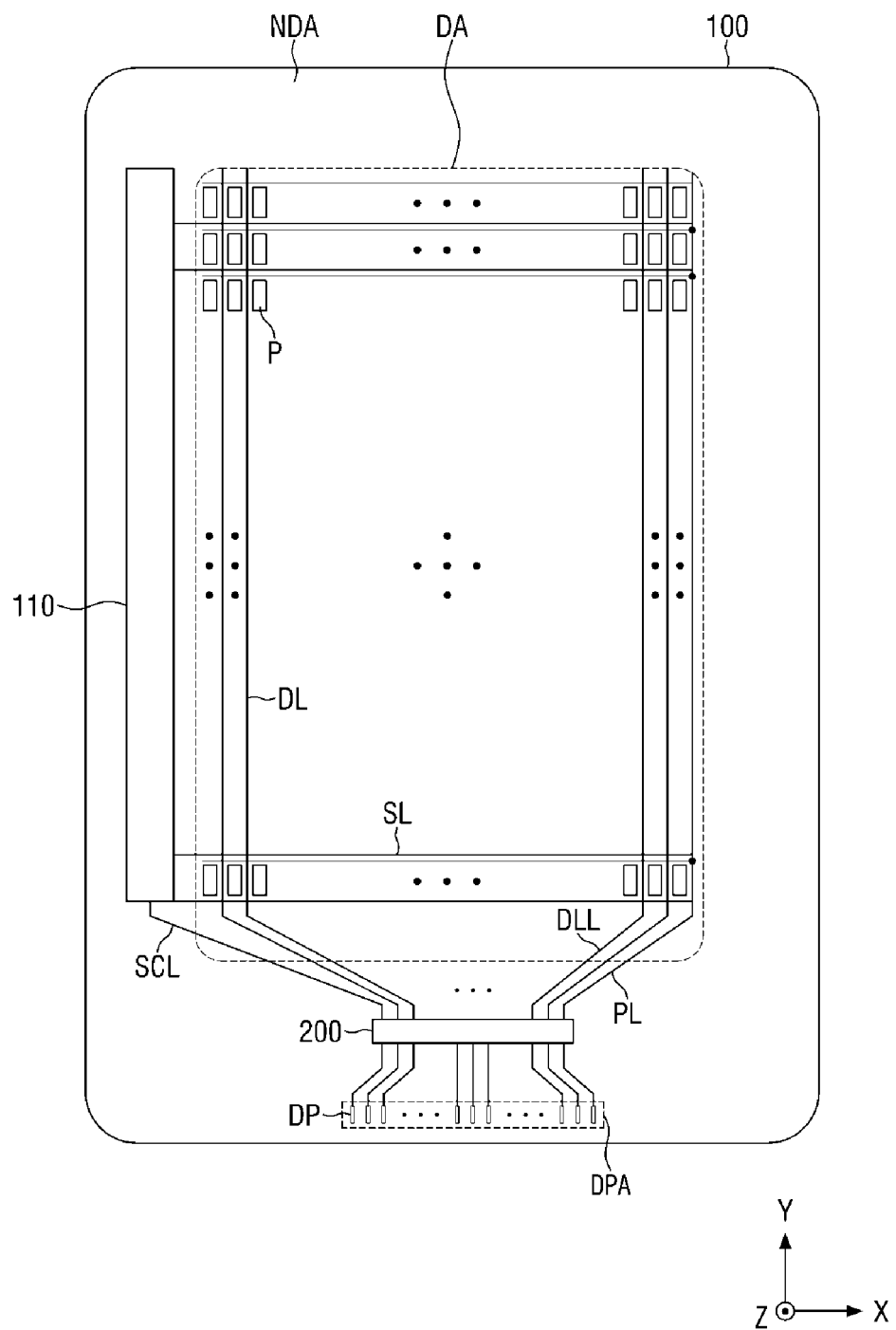
FIG. 4 is a plan view specifically showing an example of the display unit of FIG. 3.

The thin film transistor layer TFTL may be disposed on the first substrate SUB1. The thin film transistor layer TFTL may be provided with not only thin film transistors of each pixel but also scan lines, data lines, power supply lines, scan control lines, and data connection lines for connecting the display driving circuit 200 and the data lines. Each of the thin film transistors may include a gate electrode, a semiconductor layer, a source electrode, and a drain electrode. When a scan driver 110 is formed in the non-display area NDA of the display panel 100 as shown in FIG. 4, the scan driver 110 may include thin film transistors.

The thin film transistor layer TFTL may be disposed in the display area DA and the non-display area NDA. Specifically, thin film transistors, scan lines, data lines and power supply lines of each pixel of the thin film transistor layer TFTL may be disposed in the display area DA. Further, scan control lines, data connection lines and pad connection lines of the thin film transistor layer TFTL may be disposed in the non-display area NDA.

The light emitting element layer EML may be disposed on the thin film transistor layer TFTL. The light emitting element layer EML may include pixels each including a first electrode, a light emitting layer, and a second electrode, and a pixel defining film defining the pixels. The pixels of the light emitting element layer EML may be disposed in the display area DA.

The light emitting layer may be an organic light emitting layer including an organic material. In this case, the light emitting layer may include a hole transporting layer, an organic light emitting layer, and an electron transporting layer. When a predetermined voltage is applied to the first electrode through the thin film transistor of the thin film transistor layer TFTL and a cathode voltage is applied to the second electrode, holes and electrons are transferred to the organic light emitting layer through the hole transporting layer and the electron transporting layer, respectively, and are combined with each other to emit light. In this case, the first electrode may be an anode electrode, and the second electrode may be a cathode electrode.

The touch sensing unit TDU may include a second substrate SUB2 and a touch sensor layer TSL.

The second substrate SUB2 may be a rigid substrate, or may be a flexible substrate capable of bending, folding, rolling, or the like. The first substrate SUB1 may include an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. Alternatively, the second substrate SUB2 may include a metal material. Further, the second substrate SUB2 may serve as an encapsulation substrate for encapsulating the light emitting element layer EML.

The touch sensor layer TSL may be disposed on the second substrate SUB2. The touch sensor layer TSL may include touch electrodes for sensing a user's touch in a capacitance manner, touch electrode pads, and touch signal lines for connecting the touch electrode pads and the touch electrodes. For example, the touch sensor layer TSL may sense a user's touch by a self-capacitance method or a mutual capacitance method.

Figure 5:
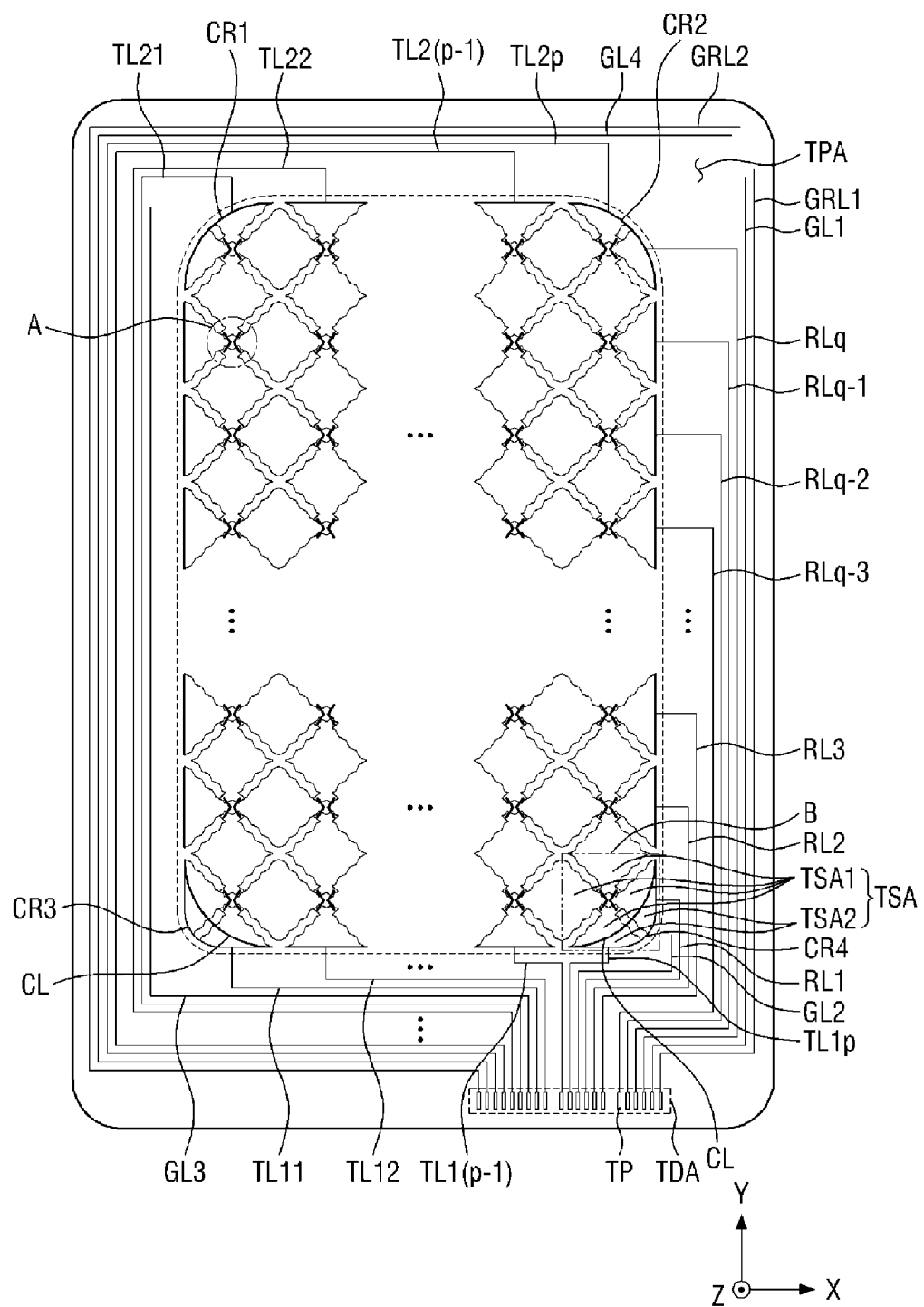
FIG. 5 is a plan view specifically showing an example of the touch sensing unit of FIG. 3.
Figure 8:
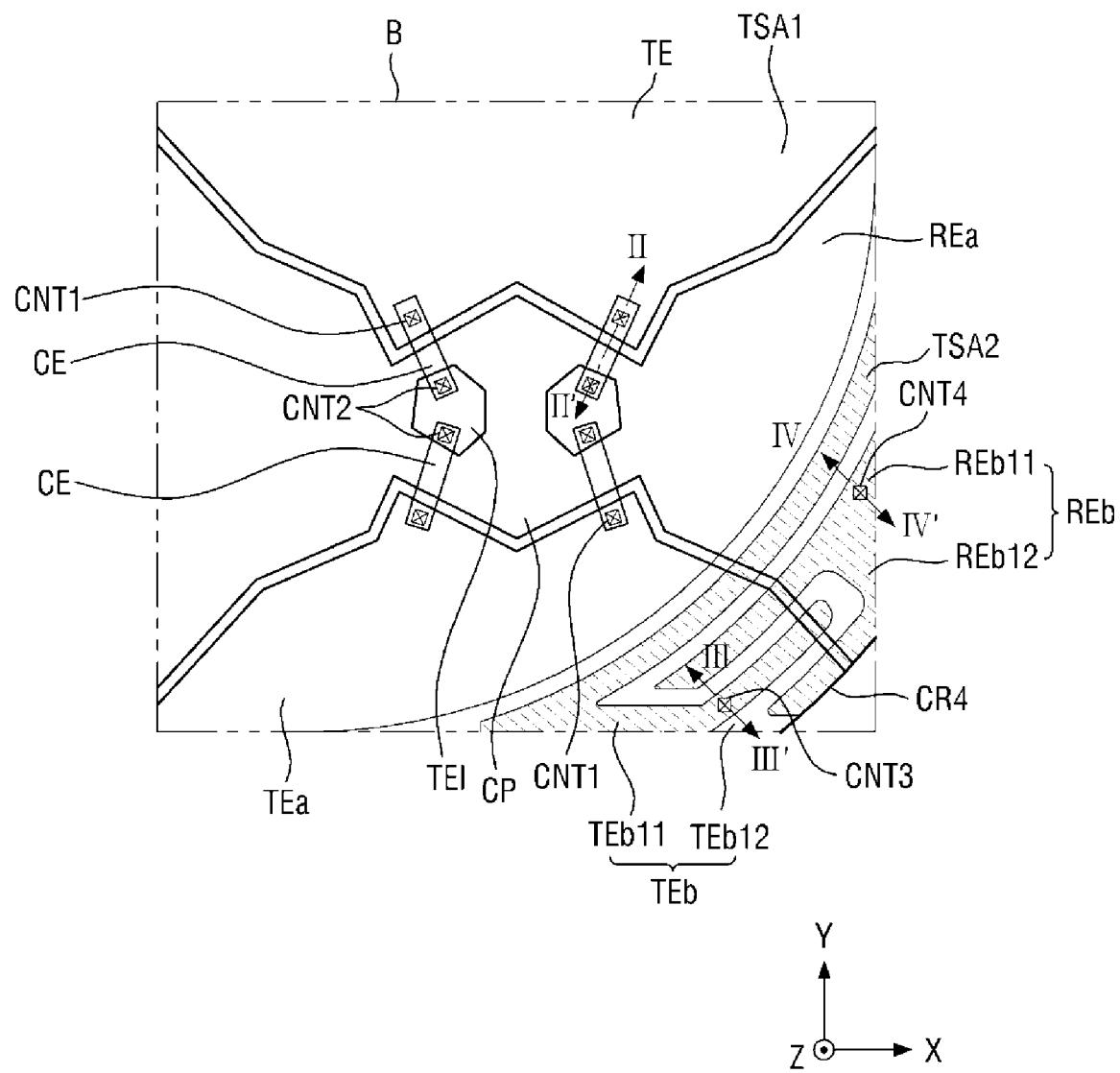
FIG. 8 is an enlarged plan view showing an example of the area B of FIG. 5.

As shown in FIGS. 5 and 8, the touch electrodes of the touch sensor layer TSL may be arranged in the touch sensor area TSA. That is, the touch sensor area TSA may be defined as an area in which first touch electrodes TE, second electrodes RE, first-first touch electrodes TEa, second-first touch electrodes REa, connection electrodes CE connecting the first touch electrodes TE adjacent to capacitance (cap) compensation patterns TEb and REb, and first touch island electrodes TE1 are arranged.

The touch sensor area TSA may overlap the display area DA of FIG. 4 in the thickness direction. The touch sensor area TSA may not overlap the non-display area NDA, but the inventive concepts are not limited thereto. The touch sensor area TSA may partially overlap the non-display area NDA.

The touch signal lines and touch electrode pads of the touch sensor layer TSL may be disposed in the touch peripheral area TPA that overlaps the non-display area NDA. The touch peripheral area TPA may be disposed around the touch sensor area TSA.

A polarizing film and a cover window may be additionally disposed on the touch sensor layer TSL. In this case, the polarizing film may be disposed on the touch sensor layer TSL, and the cover window may be attached onto the polarizing film by a transparent adhesive member.

The adhesive member SEAL may attach the first substrate SUB1 of the display unit DU to the second substrate SUB2 of the touch sensing unit TDU. The adhesive member SEAL may be a frit adhesive layer, an ultraviolet curable resin layer, or a thermosetting resin layer, but is not limited thereto.

Although it is shown in FIG. 3 that the space between the light emitting element layer EML and the substrate SUB2 is empty, the inventive concepts are not limited thereto. For example, a filling film may be disposed between the light emitting element layer EML and the second substrate SUB2. The filling film may be an epoxy filling film or a silicone filling film.

FIG. 4 is a plan view specifically showing an example of the display unit of FIG. 3. For convenience of explanation, FIG. 4 shows pixels P of the display unit DU, scan lines SL, data lines DL, a power supply line PL, scan control lines SCL, a scan driver 110, a display driving circuit 200, display electrode pads DP, data connection lines DLL, and pad connection lines PLL.

Referring to FIG. 4, the display panel may include a display area DA in which pixels are formed to display an image, and a non-display area NDA disposed around the display area DA. The non-display area NDA may be defined as an area from the outside of the display area DA to the edge of the display panel 100.

The scan lines SL, the data lines DL, the power supply line PL, and the pixels P may be disposed in the display area DA. The scan lines SL may be disposed in parallel to each other in the first direction (X-axis direction), and the data lines DL may be disposed in parallel to each other in the second direction (Y-axis direction) that intersect the first direction (X-axis direction). The power supply line PL may include at least one line disposed in parallel with the data lines DL in the second direction (Y-axis direction), and a plurality of lines branched from the at least one line in the first direction (X-axis direction).

Each of the pixels P may be connected to at least one of the scan lines SL, at least one of the data lines DL, and the power supply line PL. Each of the pixels P may include thin film transistors including a driving transistor and at least one switching transistor, an organic light emitting diode, and a capacitor. When scan signals are applied from the scan lines SL, each of the pixels P may receive data voltages from the data lines DL, and may supply a driving current to the organic light emitting diode in response to the data voltages applied to the gate electrode, thereby emitting light.

The scan driver 110, the display driving circuit 200, the scan control lines SCL, the data connection lines DLL, and the pad connection lines PLL may be disposed in the non-display area NDA.

The scan driver 110 is connected to the display driving circuit 200 through at least one scan control line SCL. Therefore, the scan driver 110 may receive a scan control signal of the display driving circuit 200. The scan driver 110 generates scan signals according to the second control signal and supplies the scan signals to the scan lines SL.

Although it is shown in FIG. 4 that the scan driver 110 is disposed in the non-display area NDA outside one side of the display area DA, the inventive concepts are not limited thereto. For example, the scan driver 110 may be disposed in the non-display area NDA outside both sides of the display area DA.

The display driving circuit 200 is connected to the display electrode pads DP of a display pad area DPA through the display connection lines PLL to receive digital video data and timing signals. The display driving circuit 200 converts the digital video data into analog positive/negative data voltages and supplies the analog positive/negative data voltages to the data lines DL through the data connection lines DLL. Further, the display driving circuit 200 generates and supplies a scan control signal for controlling the scan driver 110 through the scan control line SCL. The pixels P to which the data voltages are to be supplied may be selected by the scan signals of the scan driver 110, and data voltages may be supplied to the selected pixels P. The display driving circuit 200 may be formed as an integrated circuit (IC), and may be attached onto the substrate SUB by a chip on glass (COG) method, a chip on plastic (COP) method, or an ultrasonic bonding method.

FIG. 5 is a plan view specifically showing an example of the touch sensing unit of FIG. 3.

Referring to FIG. 5, as described above, the touch sensing unit TDU may include curved portions formed at the left and right ends thereof. The touch sensing unit TDU may include a first curved portion CR1 located at the upper left end in the second direction (Y-direction), a second curved portion CR2 located at the upper right end in the second direction (Y-direction), a third curved portion CR3 located at the lower left end in the second direction (Y-direction), and a fourth curved portion CR4 located at the lower right end in the second direction (Y-direction).

As described above, the curvature radii of the third and fourth curved portions CR3 and CR4 may be greater than the curvature radii of the first and second curved portions CR1 and CR2. That is, the lines constituting the third and fourth curved portions CR3 and CR4 may have more steep line slopes than the lines constituting the first and second curved portions CR1 and CR2.

The touch sensor area TSA of the touch sensing unit TDU may be an area surrounded by the first to fourth curved portions CR1 to CR4. The touch sensor area TSA may include a first touch sensor area TSA1 located at the center of the touch sensing unit TDU and a second touch sensor area TSA2 located in the vicinity of the first touch sensor area TSA1, as shown in FIG. 8. The center of the touch sensing unit TDU may be defined as an area in which a first touch electrode TE, a second touch electrode RE, a portion of a first-first touch electrode TEa adjacent to the first touch electrode TE, and a portion of the second-first touch electrode REa adjacent to the first touch electrode TE are arranged. The vicinity of the first touch sensor area TSA1 may be defined as an area in which another portion of the first-first touch electrode TEa spaced apart from the portion of the first-first touch electrode TEa adjacent to the first touch electrode TE, another portion of the second-first touch electrode REa spaced apart from the portion of the second-first touch electrode REa adjacent to the second touch electrode RE, and cap compensation patterns TEb and REb are arranged. Accordingly, the first touch sensor area TSA1 may be defined as an area in which the first touch electrode TE, the second touch electrode RE, a portion of the first-first touch electrode TEa adjacent to the first touch electrode TE, and a portion of the second-first touch electrode REa adjacent to the first touch electrode TE are arranged, and the second touch sensor area TSA2 may be defined as an area in which another portion of the first-first touch electrode TEa spaced apart from the portion of the first-first touch electrode TEa adjacent to the first touch electrode TE, another portion of the second-first touch electrode REa spaced apart from the portion of the second-first touch electrode REa adjacent to the second touch electrode RE, and cap compensation patterns TEb and REb are arranged.

Meanwhile, the touch sensing unit TDU may further include cap compensation patterns disposed adjacent to the third and fourth curved portions CR3 and CR4. The second touch senor area TSA2 may be disposed to overlap the cap compensation patterns disposed adjacent to the third and fourth curved portions CR3 and CR4. That is, the second touch sensor area TSA2 may be located at the lower left and right sides of the first touch sensor area TSA1 in the second direction (Y-direction).

The curvature radius of the line formed by the boundary between the cap compensation pattern adjacent to the third curved portion CR3 and the first touch sensor area TSA1 may be substantially the same as the curvature radius of the line formed by the boundary between the cap compensation pattern adjacent to the fourth curved portion CR4 and the first touch sensor area TSA1. The cap compensation pattern may include an opaque metal to serve as a screening film pattern for preventing light leakage in the second touch sensor area TSA2. In addition, as will be described later, a plurality of cap compensation patterns may be provided, and each of the plurality of cap compensation patterns may be electrically connected to the first-first touch electrode TEa and second-first touch electrode REa located on the second touch sensor area TSA2 to serve to increase the overall capacitor in the second touch sensor area TSA2.

The first touch electrodes TE and the second touch electrodes RE may be disposed in the first touch sensor area TSA1. The first touch electrodes TE and the second touch electrodes RE may be disposed to be spaced apart from each other. The first touch electrodes TE may be disposed in a plurality of columns in the second direction (Y-axis direction), and the second touch electrodes RE may be disposed in a plurality of rows in the first direction (X-axis direction). The first touch electrodes TE disposed in each of the plurality of columns in the second direction (Y-axis direction) may be electrically connected to each other. Further, the second touch electrodes RE disposed in each of the plurality of rows in the first direction (X-axis direction) may be electrically connected to each other.

The first touch electrodes TE and second touch electrodes RE disposed in the first touch sensor area TSA1 may be generally formed in a diamond shape or a triangular shape on a plane. Specifically, the first touch electrodes TE and second touch electrodes RE disposed on the edge of the first touch sensor area TSA1 may be formed in a triangular shape on the plane, and other first touch electrodes TE and second touch electrodes RE may be formed in a diamond shape on the plane.

In contrast, the areas of the first and second touch electrodes TEa and REa disposed in the second touch sensor area TSA2 may be partially reduced along the curved line of the first to further curved portions CR1 to CR4 of the touch sensing unit TDU to allow the first and second touch electrodes TEa and Rea to have an amorphous shape different from the aforementioned triangular shape on the plane. That is, the first and second touch electrodes TEa and REa may have a shape formed by cutting at least one vertex of the triangular shape along the curved line of the first to further curved portions CR1 to CR4 of the touch sensing unit TDU.

Further, in order to prevent a moire phenomenon from occurring by the first touch electrodes TE and TEa and the second touch electrodes RE and REa when viewing an image of the display device 10, the first touch electrodes TE and TEa and the second touch electrodes RE and REa may have convex sides on the plane.

In order to prevent the first touch electrodes TE and TEa and the second touch electrodes RE and REa from being shorted to each other at their intersection regions, the first touch electrodes TE and TEa adjacent to each other in the second direction (Y-axis direction) may be electrically connected through the connection electrode CE. In this case, the first touch electrodes TE and TEa and the second touch electrodes RE and REa may be disposed on one layer, and the connection electrode CE may be disposed on a different layer from the first touch electrodes TE and TEa and the second touch electrodes RE and REa. Thus, the first touch electrodes TE and TEa electrically connected in the second direction (Y-axis direction) may be electrically insulated from the second touch electrodes RE electrically connected in the first direction (X-axis direction).

First touch signal lines TL11 to TL1$p$ ($p$ is a positive integer of 2 or more), second touch signal lines TL21 to TL2$p$ ($p$ is a positive integer of 2 or more), third touch signal lines RL1 to RL$q$ ($q$ is a positive integer of 2 or more), and touch electrode pads TP may be disposed in the touch peripheral area TPA.

One ends of the first touch signal lines TL11 to TL1$p$ may be connected to the first touch electrodes TE disposed at the first side of the touch sensor area TSA. The first side of the touch sensor area TSA may be a side closest to the touch pad area TDA where the touch electrode pads TP are disposed, among the four sides of the touch sensor area TSA. The other ends of the first touch signal lines TL11 to TL1$p$ may be connected to some touch electrode pads TP of the touch pad area TDA. That is, the first touch signal lines TL11 to TL1$p$ may serve to connect the first touch electrodes TE disposed at the first side of the touch sensor area TSA to some touch electrode pads TP of the touch pad area TDA.

For example, as shown in FIG. 5, the first-first touch signal line TL11 may be electrically connected to the first touch electrodes TE disposed in the first column of the touch sensor area TSA, and the first-second touch signal line TL12 may be electrically connected to the first touch electrodes TE disposed in the second column of the touch sensor area TSA. Further, the first-(p−1)th touch signal line TL1($p$−1) may be electrically connected to the first touch electrodes TE disposed in the (p−1)th column of the touch sensor area TSA, and the first-(p)th touch signal line TL1$p$ may be electrically connected to the first touch electrodes TE disposed in the (p)th column of the touch sensor area TSA. In this case, the first column of the touch sensor area TSA may be a column disposed at the leftmost side of the touch sensor area TSA, and the (p)th column may be a column disposed at the rightmost side of the touch sensor area TSA.

One ends of the second touch signal lines TL21 to TL2$p$ may be connected to the first touch electrodes TE disposed at the second side of the touch sensor area TSA. The second side of the touch sensor area TSA may be a side opposite to the first side, that is, a side where an indented area EA is formed. The other ends of the second touch signal lines TL21 to TL2$p$ may be connected to other touch electrode pads TP of the touch pad area TDA. That is, the second touch signal lines TL21 to TL2$p$ serve to connect the first touch electrodes TE disposed at the second side of the touch sensor area TSA to other touch electrode pads TP of the touch pad area TDA.

For example, as shown in FIG. 5, the second-first touch signal line TL21 may be electrically connected to the first touch electrodes TE disposed in the first column of the touch sensor area TSA, and the second-second touch signal line TL22 may be electrically connected to the first touch electrodes TE disposed in the second column of the touch sensor area TSA. Further, the second-(p−1)th touch signal line TL2-($p$−1) may be electrically connected to the first touch electrodes TE disposed in the (p−1)th column of the touch sensor area TSA, and the second-(p)th touch signal line TL2$p$ may be electrically connected to the first touch electrodes TE disposed in the (p)th column of the touch sensor area TSA.

One end of each of the third touch signal lines TL31 to TL3$q$ may be connected to the second touch electrodes RE disposed at the third side of the touch sensor area TSA. The third side of the touch sensor area TSA may be a side opposite to the fourth side of the touch sensor area TSA. The other ends of the third touch signal lines TL31 to TL3$q$ may be connected to other touch electrode pads TP of the touch pad area TDA. That is, the third touch signal lines TL31 to TL3$q$ serve to connect the second touch electrodes RE disposed at the third side of the touch sensor area TSA to other touch electrode pads TP of the touch pad area TDA.

For example, as shown in FIG. 5, the third-first touch signal line RL1 may be electrically connected to the second touch electrodes RE disposed in the first row of the touch sensor area TSA, the third-second touch signal line RL2 may be electrically connected to the second touch electrodes RE disposed in the second row of the touch sensor area TSA, and the third-third touch signal line RL3 may be electrically connected to the second touch electrodes RE disposed in the third row of the touch sensor area TSA. Further, the third-(q−2)th touch signal line RLq-2 may be electrically connected to the second touch electrodes RE disposed in the (q−2)th column of the touch sensor area TSA, the third-(q−1)th touch signal line RLq−1 may be electrically connected to the second touch electrodes RE disposed in the (q−1)th column of the touch sensor area TSA, and the third-(q)th touch signal line RLq may be electrically connected to the second touch electrodes RE disposed in the (q)th row of the touch sensor area TSA.

The touch electrode pads TP may be disposed at one side of the second substrate SUB2. The touch circuit board 410 may be attached onto the touch electrode pads TP using an anisotropic conductive film. Thus, the touch electrode pads TP may be electrically connected to the touch circuit board 410.

The first touch electrodes TE and the second touch electrodes RE may be driven by a mutual capacitance method or a self-capacitance method.

First, when the first touch electrodes TE and the second touch electrodes RE are driven by a mutual capacitance method, touch driving signals are supplied to the first touch electrodes TE through the first touch signal lines TL11 to TL1$p$ and the second touch signal lines TL21 to TL2$p$, and thus, the mutual capacitances formed in the intersection regions of the first touch electrodes TE and the second touch electrodes RE are charged. Then, charge variations of the mutual capacitances are measured through the second touch electrodes RE, and whether a touch is input is determined in accordance with the charge variations of the mutual capacitances. The touch driving signals may be signals having a plurality of touch driving pulses.

Second, when the first touch electrodes TE and the second touch electrodes RE are driven by a self-capacitance method, touch driving signals are supplied to both the first touch electrodes TE and the second touch electrodes RE through the first touch signal lines TL11 to TL1$p$, the second touch signal lines TL21 to TL2$p$, and the third touch signal lines RL1 to RLq, and thus, the self-capacitances of the first touch electrodes TE and the second touch electrodes RE are charged. Then, charge variations of the self-capacitances are measured through the first touch signal lines TL11 to TL1$p$, the second touch signal lines TL21 to TL2$p$, and the third touch signal lines RL1 to RLq, and whether a touch is input is determined in accordance with the charge variations of the self-capacitances.

Hereinafter, for convenience of explanation, there will be mainly described a case where a plurality of touch driving pulses are applied to the first touch electrodes TE and the first touch electrodes TE and the second touch electrodes RE are driven by a mutual capacitance method in which charge variations of mutual capacitances are measured through the third touch signal lines RL1 to RLq connected to the second touch electrodes RE. In this case, the first touch electrodes TE may function as touch driving electrodes, the second touch electrodes RE may function as touch sensing electrodes, the first touch signal lines TL11 to TL1$p$ and the second touch signal lines TL21 to TL2$p$ may function as touch driving lines, and the third touch signal lines RL1 to RLq may function as touch sensing lines.

Further, a first guard line GL1, a second guard line GL2, a third guard line GL3, a first ground line GRL1, and a second ground line GRL2 may be disposed in the touch peripheral area TPA.

The first guard line GL1 may be disposed outside the third-qth touch signal line RLq disposed at the outermost side of the third touch signal lines RL1 to RLq. Further, the first ground line GRL1 may be disposed outside the first guard line GL1. That is, since the first guard line GL1 is disposed between the third-qth touch signal line RLq disposed at the outermost side of the third touch signal lines RL1 to RLq and the first ground line GRL1, the first guard line GL1 may serve to minimize the influence of the voltage variation of the first ground line GRL1 on the third-qth touch signal line RLq. One end of the first guard line GL1 and one end of the first ground line GRL1 may be connected to the touch electrode pads disposed on the rightmost side.

The second guard line GL2 may be disposed between the third-first touch signal line RL1 disposed at the innermost side of the third touch signal lines RL1 to RLq and the (1−p)th touch signal line TL1p. Thus, the second guard line GL2 may serve to minimize the influence of the third-first touch signal line RL1 and the (1−p)th touch signal line TL1p on each other. One end of the second guard line GL2 may be connected to the touch electrode pads.

The third guard line GL3 may be disposed between the second-first touch signal line TL21 disposed at the innermost side of the second touch signal lines TL21 to TL2p and the first-first touch signal line TL11. Thus, the third guard line GL3 may serve to minimize the influence of the first-first touch signal line TL11 and the second-first touch signal line TL21 on each other. One end of the third guard line GL3 may be connected to the touch electrode pads.

The fourth guard line GL4 may be disposed outside the second-pth touch signal line TL2p disposed at the outermost side of the second touch signal lines TL21 to TL2p. Further, the second ground line GRL2 may be disposed outside the fourth guard line GL4. That is, since the fourth guard line GL4 is disposed between the second-pth touch signal line RL2p disposed at the outermost side of the second touch signal lines TL21 to TL2p and the second ground line GRL2, the fourth guard line GL4 may serve to minimize the influence of the voltage variation of the second ground line GRL2 on the second-pth touch signal line TL2p. One end of the fourth guard line GL4 and one end of the second ground line GRL2 may be connected to the touch electrode pads disposed on the rightmost side.

The first ground line GRL1 may be disposed at the outermost side from the right side of the touch sensing unit 500, the second ground line GRL2 may be disposed at the outermost side of the lower side, left side, and upper side of the touch sensing unit 500, and ground voltages may be applied to the first ground line GRL1 and the second ground line GRL2. Thus, when static electricity is applied from the outside, the static electricity may be discharged to the first ground line GRL1 and the second ground line GRL2.

Meanwhile, when the first touch electrodes TE and the second touch electrodes RE are driven by a mutual capacitance method, it is preferable that ground voltages are applied to the first guard line GL1, the second guard line GL2, the third guard line GL3, and the fourth guard line GL4.

Figure 6:
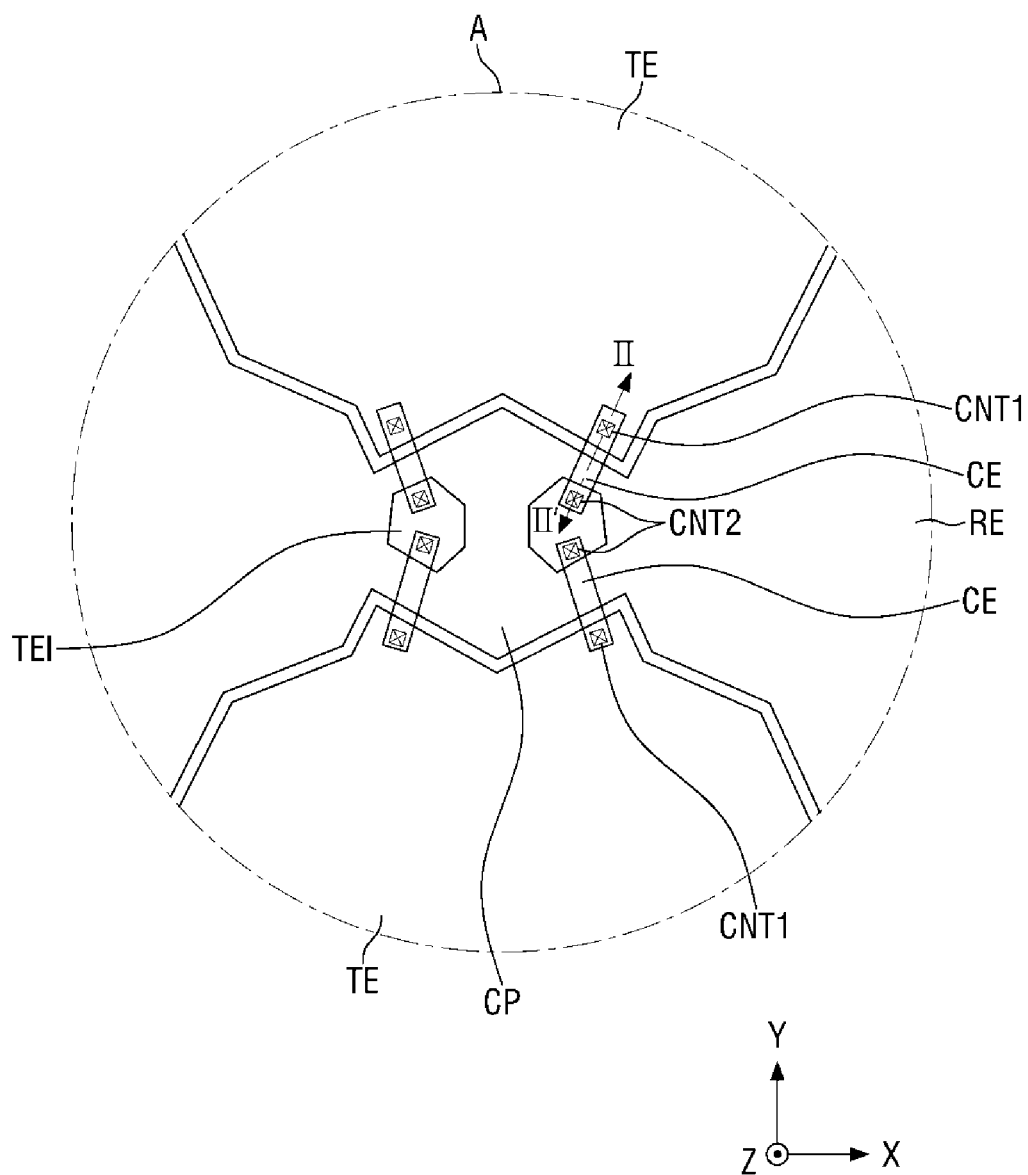
FIG. 6 is an enlarged plan view showing an example of the area A of FIG. 5.
Figure 7:
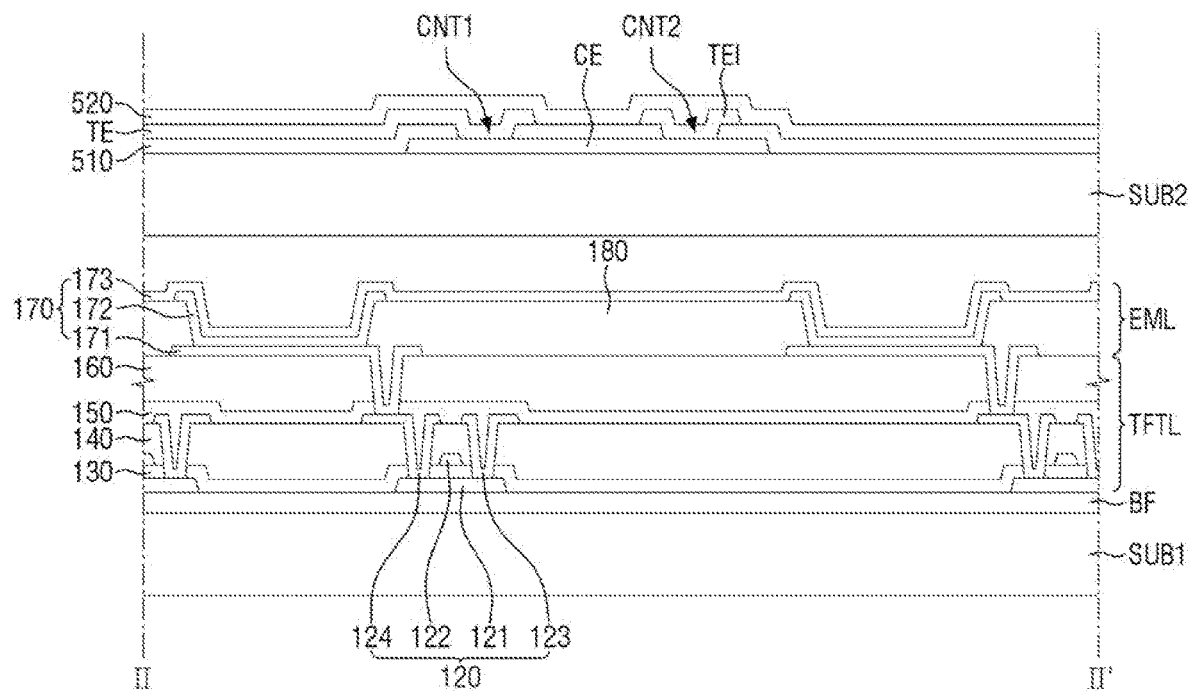
FIG. 7 is an example of a cross-sectional view taken along the line of FIG. 6.
Figure 9:
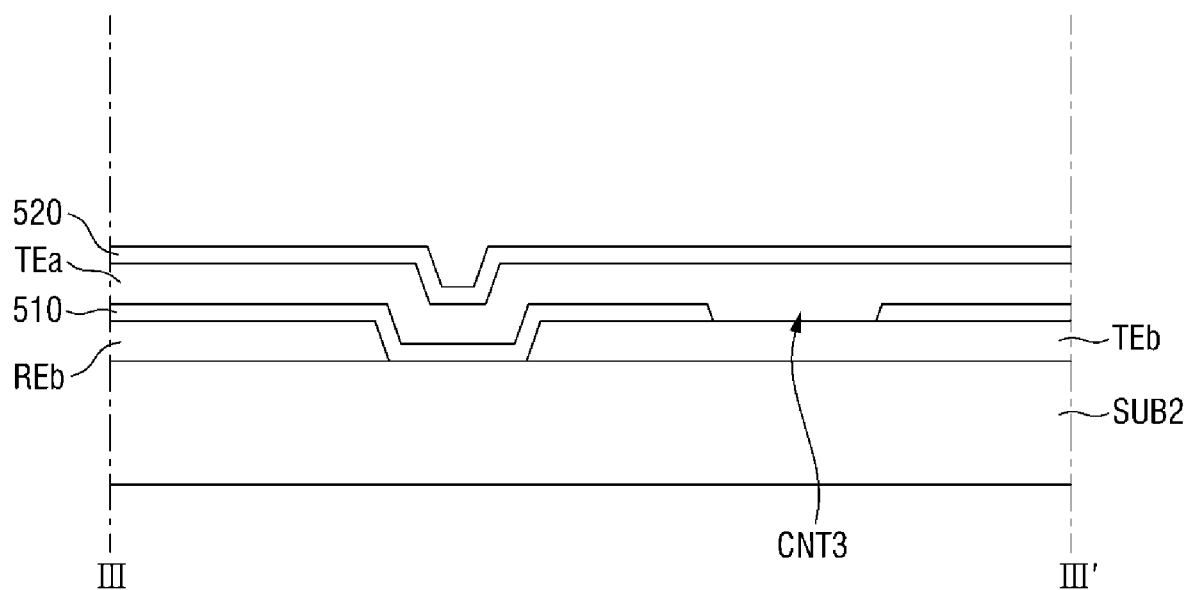
FIG. 9 is an example of a cross-sectional view taken along the line III-III' of FIG. 8.
Figure 10:
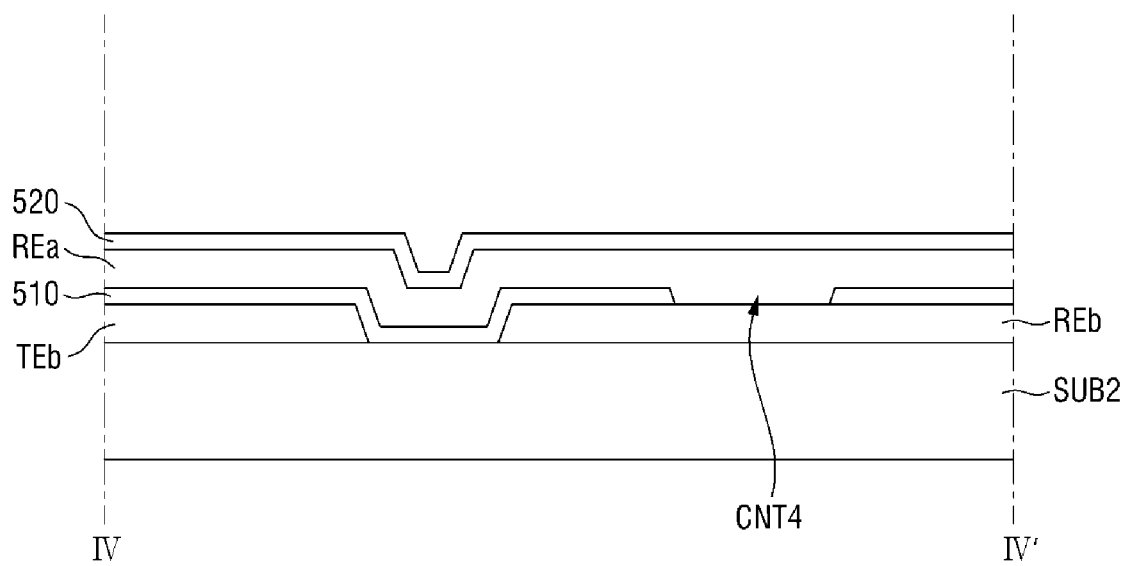
FIG. 10 is an example of a cross-sectional view taken along the line IV-IV' of FIG. 8.
Figure 11:
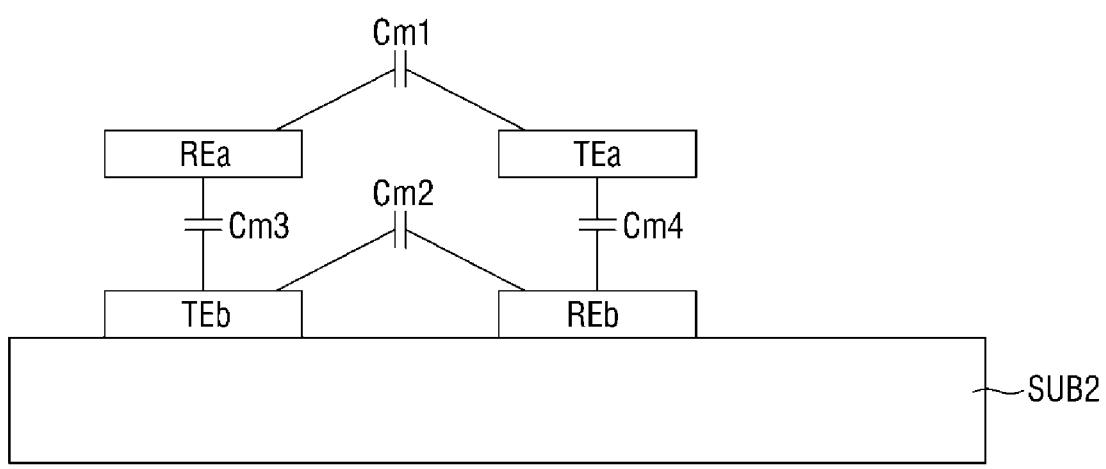
FIG. 11 is a schematic diagram showing a capacitance Cm compensated in a second touch sensor area.

FIG. 6 is an enlarged plan view showing an example of the area A of FIG. 5; FIG. 7 is an example of a cross-sectional view taken along the line II-II' of FIG. 6; FIG. 8 is an enlarged plan view showing an example of the area B of FIG. 5; FIG. 9 is an example of a cross-sectional view taken along the line III-III' of FIG. 8; FIG. 10 is an example of a cross-sectional view taken along the line IV-IV' of FIG. 8; and FIG. 11 is a schematic diagram showing a capacitance Cm compensated in a second touch sensor area. In FIG. 8, the touch electrode adjacent to the fourth curved portion CR4 and the cap compensation pattern will be described. However, a description of the touch electrode and the cap compensation pattern, which will be described later, may also be applied to the third curved portion CR3.

Referring to FIGS. 6 to 11, the thin film transistor layer TFTL is formed on the first substrate SUB1. The thin film transistor layer TFTL includes thin film transistors 120, a gate insulating film 130, an interlayer insulating film 140, a protective film 150, and a planarization film 160.

A buffer film BF may be formed on one surface of the first substrate SUB1. The buffer film BF is formed on one surface of the substrate SUB so as to protect thin film transistors 120 and the organic light emitting layer 172 of the light emitting element layer EML from moisture permeating through the first substrate SUB1 vulnerable to moisture permeation. The buffer film BF may be formed of a plurality of alternately laminated inorganic films. For example, the buffer film BF may be formed of a multi-layer film in which one or more inorganic layers of a silicon nitride layer, a silicon oxynitride layer, a silicon oxide layer, a titanium oxide layer, and an aluminum oxide layer are alternately laminated. The buffer film BF may be omitted.

The thin film transistor 120 is formed on the buffer film BF. The thin film transistor 120 includes an active layer 121, a gate electrode 122, a source electrode 123, and a drain electrode 124. Although it is shown in FIG. 7 that the thin film transistor 120 is formed by a top gate manner in which the gate electrode 122 is located on the active layer 121, it should be noted that the inventive concepts are not limited thereto. That is, the thin film transistors 120 may be formed by a bottom gate manner in which the gate electrode 122 is located beneath the active layer 121, or may be formed by a double gate manner in which the gate electrode 122 is located both on and beneath the active layer 121.

The active layer 121 is formed on the buffer film BF. The active layer 121 may include an organic semiconductor such as polycrystalline silicon, monocrystalline silicon, low-temperature polycrystalline silicon, or amorphous silicon, or an oxide semiconductor. A light blocking layer for blocking external light incident on the active layer 121 may be formed between the buffer film BF and the active layer 121.

The gate insulating film 130 may be formed on the active layer 121. The gate insulating film 130 may be formed of an inorganic layer, for example, a silicon nitride layer, a silicon oxynitride layer, a silicon oxide layer, a titanium oxide layer, or an aluminum oxide layer.

The gate electrode 122 and a gate line may be formed on the gate insulating film 130. The gate electrode 122 and the gate line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The interlayer insulating film 140 may be formed on the gate electrode 122 and the gate line. The interlayer insulating film 140 may be formed of an inorganic layer, for example, a silicon nitride layer, a silicon oxynitride layer, a silicon oxide layer, a titanium oxide layer, or an aluminum oxide layer.

The source electrode 123 and the drain electrode 124 may be formed on the interlayer insulating film 140. Each of the source electrode 123 and the drain electrode 124 may be connected to the active layer 121 through a contact hole that penetrates the gate insulating film 130 and the interlayer insulating film 140. The source electrode 123 and the drain electrode 124 may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The protective film 150 for insulating the thin film transistor 120 may be formed on the source electrode 123 and the drain electrode 124. The protective film 150 may be formed of an inorganic layer, for example, a silicon nitride layer, a silicon oxynitride layer, a silicon oxide layer, a titanium oxide layer, or an aluminum oxide layer.

The planarization film 160 for planarizing a step due to the thin film transistor 120 may be formed on the protective film 150. The planarization film 160 may be formed of an organic film including an acryl resin, an epoxy resin, a phenolic resin, a polyamide resin, or a polyimide resin.

A light emitting element layer EML is formed on the thin film transistor layer TFTL. The light emitting element layer EML includes light emitting elements 170 and a pixel defining film 180.

The light emitting elements 170 and the pixel defining film 180 are formed on the planarization film 160. Each of the light emitting elements 170 may include a first electrode 171, an organic light emitting layer 172, and a second electrode 173.

The first electrode 171 may be formed on the planarization film 160. The first electrode 171 is connected to the source electrode 123 of the thin film transistor 120 through a contact hole penetrating the protective film 150 and the planarization film 160.

In a top emission structure in which light is emitted toward the second electrode 173 with respect to the organic light emitting layer 172, the first electrode 171 may be formed of a metal material having high reflectance such as a laminate structure (Ti/Al/Ti) of aluminum and titanium, a laminate structure (ITO/Al/ITO) of aluminum and ITO, an APC alloy, or a laminate structure (ITO/APC/ITO) of an APC and ITO. The APC alloy is an alloy of silver (Ag), palladium (Pd), and copper (Cu).

In a bottom emission structure in which light is emitted toward the first electrode 171 with respect to the organic light emitting layer 172, the first electrode 171 may be formed of a transparent conductive material (TCO), such as ITO or IZO, which can transmit light, or a semi-transmissive conductive material, such as magnesium (Mg), silver (Ag), or an alloy of magnesium (Mg) and silver (Ag). In this case, when the first electrode 171 is formed of a semi-transmissive conductive material, light emission efficiency may be increased by microcavities.

The pixel defining film 180 may be formed on the planarization film 160 to divide the first electrode 171 so as to define pixels. The pixel defining film 180 may be formed to cover the edge of the first electrode 171. The pixel defining film 180 may be formed of an organic film including an acryl resin, an epoxy resin, a phenolic resin, a polyamide resin, or a polyimide resin.

Each of the pixels P indicates an area where the first electrode 171, the organic light emitting layer 172, and the second electrode 173 are sequentially laminated, and holes from the first electrode 171 are combined with electrons from the second electrode 173 to emit light.

The organic light emitting layer 172 is formed on the first electrode 171 and the pixel defining film 180. The organic light emitting layer 172 may include an organic material to emit light of a predetermined color. For example, the organic light emitting layer 172 may include a hole transporting layer, an organic material layer, and an electron transporting layer. In this case, the organic light emitting layer 172 of the red pixel may emit red light, the organic light emitting layer 172 of the green pixel may emit green light, and the organic light emitting layer 172 of the blue pixel may emit blue light. Alternatively, the organic light emitting layers 172 of the pixels P may emit white light And, in this case, the red pixel may further include a red color filter layer, the green pixel may further include a green color filter layer, and the blue pixel may further include a blue color filter layer.

The second electrode 173 is formed on the organic light emitting layer 172. The second electrode 173 may be formed to cover the organic light emitting layer 172. The second electrode 173 may be a common layer commonly formed in the pixels P. A capping layer may be formed on the second electrode 173.

In the top emission structure, the second electrode 173 may be formed of a transparent conductive material (TCO) such as ITO or IZO, which can transmit light, or a semi-transmissive conductive material such as magnesium (Mg), silver (Ag), or an alloy of magnesium (Mg) and silver (Ag). When the second electrode 173 is formed of a semi-transmissive conductive material, light emission efficiency may be increased by microcavities.

In the bottom emission structure, the second electrode 173 may be formed of a metal material having high reflectance such as a laminate structure (Ti/Al/Ti) of aluminum and titanium, a laminate structure (ITO/Al/ITO) of aluminum and ITO, an APC alloy, or a laminate structure (ITO/APC/ITO) of an APC and ITO. The APC alloy is an alloy of silver (Ag), palladium (Pd), and copper (Cu).

The second substrate SUB2 is disposed on the light emitting element layer EML, and the touch sensor layer TSL is formed on the second substrate SUB2. The touch sensor layer TSL may include first touch electrodes TE, second touch electrodes RE, connection electrodes CE, a first-first touch electrode TEa, and a second-first touch electrode REa, cap compensation patterns TEb and REb, first touch signal lines TL11 to TL1$p$, second touch signal lines TL21 to TL2$p$, third touch signal lines RL1 to RL$q$, guard lines. GL1, GL2, GL3, and GL4, and ground lines GRL1 and GRL2.

For convenience of explanation, FIG. 7 illustrates only the first touch electrodes TE and second touch electrode RE of the touch sensor layer TSL, first touch island electrodes TEI disposed between the first touch electrodes TE, and the connection electrode CE. The first-first touch electrode TEa and the second-first touch electrode REa are referred to as a first touch electrode TE and a second touch electrode RE whose shapes are cut by the third and fourth curved portions CR3 and CR4, respectively.

The connection electrodes CE and the cap compensation patterns TEb and REb are formed on the second substrate SUB2. Each of the connection electrodes CE connects the first touch electrode TE and the first touch island electrode TEI. That is, one end of each of the connection electrodes CE may be connected to the first touch electrode TE through a first contact hole CNT1 of a first insulating film 510, and the other end thereof may be connected to the first touch island electrode TEI through a second contact hole CNT2 of the first insulating film 510.

Each of the connection electrode CE and the cap compensation patterns TEb and REb may be formed of an opaque metal conductive layer. For example, each of the connection electrode CE and the cap compensation patterns TEb and REb may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof. For example, the connection electrode CE and the cap compensation patterns TEb and REb may include the same material as each other, but the inventive concepts are not limited thereto.

As described above, the cap compensation patterns TEb and REb may be disposed in the second touch sensor area TSA2. The first cap compensation pattern TEb is disposed to be spaced apart from and insulated from the second cap compensation pattern REb. The first cap compensation pattern TEb may be integrally formed on the plane, and the second cap compensation pattern Reb may be integrally formed on the plane.

The first cap compensation pattern TEb and the second cap compensation pattern REb may be disposed to overlap the adjacent first-first touch electrode TEa and the adjacent second-1 touch electrode REa in a thickness direction, respectively. Further, each of the first cap compensation pattern TEb and the second cap compensation pattern REb may also be disposed to overlap a gap between the first-first touch electrode TEa and the second-first touch electrode REa in the thickness direction.

The first cap compensation pattern TEb may be electrically connected to the first-first touch electrode TEa through a third contact hole CNT3 of the first insulating film 510, and the second cap compensation pattern REb may be electrically connected to the second-first touch electrode REa through a fourth contact hole CNT4 of the first insulating film 510. In an embodiment, one third contact hole CNT3 and one fourth contact hole CNT4 are provided, but the inventive concepts are not limited thereto. A plurality of third contact holes CNT3 and a plurality of fourth contact holes CNT4 may be provided, and their positions are not limited.

That is, the first cap compensation pattern TEb may be electrically connected to the first-first touch electrode TEa, and the second cap compensation pattern REb may be electrically connected to the second-first touch electrode REa, thereby compensating the capacitance reduced by the first-first touch electrode TEa and the second-first touch electrode REa whose areas are reduced by the fourth curved portion CR4.

The cap compensation patterns TEb and REb may have extension patterns and main patterns, respectively. The extension patterns of the cap compensation patterns TEb and Reb may be branched from the main patterns in one direction, respectively. For example, as shown in FIG. 8, the first cap compensation pattern TEb may include a plurality of extension patterns extending from the main patterns in a direction between the first direction (X-axis direction) or in an upper right direction on the plane. Similarly to the first cap compensation pattern TEb, the second cap compensation pattern REb may include a plurality of extension patterns extending from the main patterns in a direction between the first direction (X-axis direction) or in a lower left direction on the plane.

The plurality of extension patterns of the first cap compensation pattern TEb and the plurality of extension patterns of the second cap compensation pattern REb may be alternately arranged. That is, as shown in FIG. 8, the first cap compensation pattern TEb may include a first-first extension pattern TEb11 closest to the first touch sensor area TSA1 and a first-second extension pattern TEb11 physically connected to the first-first extension pattern TEb11, and the second cap compensation pattern REb may include a second-first extension pattern REb11 closest to the first touch sensor area TSA1 and a second-second extension pattern REb12 physically connected to the second-first extension pattern REb11. The first-first extension pattern TEb11, the second-first extension pattern REb11, the first-second extension pattern TEb12, and the second-second extension pattern REb12 may be arranged sequentially in the order adjacent to the first touch sensor area TSA1. That is, the second-first extension pattern REb11 may be disposed between the first-first extension pattern TEb11 and the first-second extension pattern TEb12, and the first-second extension pattern TEb12 may be disposed between the second-first extension pattern REb11 and the second-second extension pattern REb12.

Although it is shown in FIG. 8 that each of the cap compensation patterns TEb and REb has two extension patterns, the inventive concepts are not limited thereto, and each of the cap compensation patterns TEb and REb may have one extension pattern or three or more extension patterns.

In addition, the extension directions of the extension patterns of the cap compensation patterns TEb and REb are not limited thereto. For example, the extension directions of the extension patterns of the cap compensation patterns TEb and REb may be an upper left direction and a lower right direction, respectively, from the main patterns.

In some embodiments, the cap compensation patterns TEb and REb may include a plurality of extension patterns spaced apart from each other without including the main patterns. In this case, the extension patterns of each of the cap compensation patterns TEb and Reb may be in electrical contact with the first and second touch electrodes TEa and REa located in the adjacent second touch sensor area TSA2, respectively.

The first insulating film 510 is formed on the connection electrode CE and the cap compensation patterns TEb and REb. The first insulating film 510 may be formed of an inorganic layer, for example, a silicon nitride layer, a silicon oxynitride layer, a silicon oxide layer, a titanium oxide layer, or an aluminum oxide layer. The first insulating film 510 may include the aforementioned contact holes CNT1 to CNT4.

The first touch electrodes TE, the first touch island electrodes TEI, the second touch electrodes RE, the first-first touch electrodes TEa, and the second-first touch electrodes REa are disposed on the first insulating film 510.

As described above, the areas of the first-first touch electrode TEa and the second-first touch electrode REa are reduced as compared with the areas of the first touch electrode TE and the second touch electrode RE located at the edges of the first-first touch electrode TEa and the second-first touch electrode Rea by the fourth curved portion CR4 of the touch sensing unit TDU, and may be smaller than the areas of the first touch electrode TE and the second touch electrode RE whose areas are reduced by the first curved portion.

Thus, the capacitance charge rate may be reduced due to the first-first touch electrode TEa and the second-first touch electrode REa, the second touch electrode RE connected to the first-first touch electrode TEa and the second-first touch electrode REa, and the first touch electrode TE connected to the first-first touch electrode TEa and the second-first touch electrode REa through the connection electrode CE. Thus, in the touch sensor area TSA where the first-first touch electrode TEa and the second-first touch electrode REa, the second touch electrode RE connected to the first-first touch electrode TEa and the second-first touch electrode REa, and the first touch electrode TE connected to the first-first touch electrode TEa and the second-first touch electrode REa through the connection electrode CE are disposed, the touch detection power in the corresponding area may be deteriorated.

However, the touch sensing unit TDU may pattern a metal screening film disposed on the same layer as the connection electrode CE to prevent light leakage in the second touch sensor area TSA2, and may include the cap compensation patterns TEb and REb electrically connected to the first-first touch electrode TEa and the second-first touch electrode REa whose areas are reduced, thereby compensating for the capacitance due to the first-first touch electrode TEa and the second-first touch electrode REa whose areas are reduced by the fourth curved portion CR4.

That is, as shown in FIGS. 8 and 11, second capacitance Cm2 between the first cap compensation pattern TEb and the second cap compensation pattern REb, third capacitance Cm3 between the second-first touch electrode REa and the first cap compensation pattern TEb, and fourth capacitance Cm4 between the first-first touch electrode TEa and the second cap compensation pattern REb as well as first capacitance Cm1 due to the first-first touch electrode TEa and the second-first touch electrode Rea are further provided, thereby compensating for the capacitance due to the first-first touch electrode TEa and the second-first touch electrode REa whose areas are reduced by the fourth curved portion CR4. Accordingly, in the touch sensor area TSA where the first-first touch electrode TEa and the second-first touch electrode REa, the second touch electrode RE connected to the first-first touch electrode TEa and the second-first touch electrode REa, and the first touch electrode TE connected to the first-first touch electrode TEa and the second-first touch electrode REa through the connection electrode CE are disposed, it is possible to prevent the deterioration of touch detection power in the corresponding area.

Hereinafter, display devices according to other exemplary embodiments will be described. In the following exemplary embodiments, the same components as the already described embodiment are referred to by the same reference numerals, and duplicate descriptions thereof will be omitted or simplified.

Figure 12:
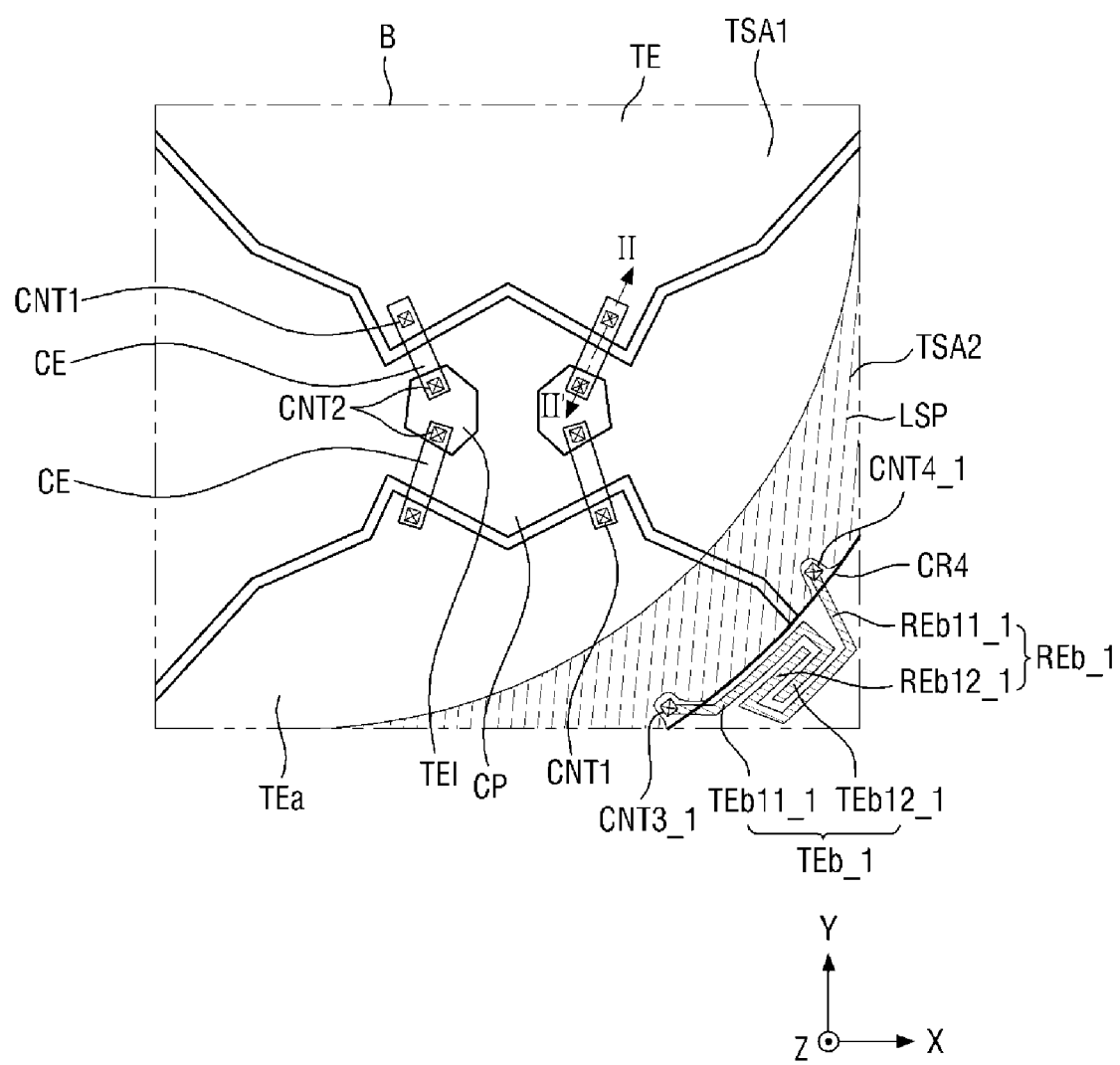
FIG. 12 is an enlarged plan view showing a touch sensor area and a touch peripheral area according to another exemplary embodiment of the invention.

FIG. 12 is an enlarged plan view showing a touch sensor area and a touch peripheral area according to another exemplary embodiment.

Referring to FIG. 12, a touch sensor layer TSL_1 according to the present exemplary embodiment is different from the aforementioned touch sensor layer TSL in that a plurality of cap compensation patterns TEb_1 and REb_1 are disposed in the touch peripheral area TPA.

More specifically, the touch sensor layer TSL_1 according to the present exemplary embodiment may include a first cap compensation TEb_1 electrically connected to the first-first touch electrode TEa in the touch peripheral area TPA, specifically, the touch peripheral area TAP adjacent to the fourth curved portion CR4 of the touch sensing unit TDU, and a second cap compensation pattern REb_1 electrically connected to the second-first touch electrode REa.

The first cap compensation pattern TEb_1 may be in contact with the first-first touch electrode TEa through a third contact hole CNT3_1 of the first insulating film 510, and the second cap compensation pattern REb_1 may be in contact with the second-first touch electrode REa through a fourth contact hole CNT4_1 of the first insulating film 510.

The first cap compensation pattern TEb_1 and the second cap compensation pattern REb_1 may be formed on the same layer as the connection electrode CE. The first cap compensation pattern TEb_1 and the second cap compensation pattern REb_1 may be disposed on the same layer as a metal screening film pattern LSP, and may be electrically insulated from the metal screening film pattern LSP. That is, the first cap compensation pattern TEb_1 and the second cap compensation pattern REb_1 may be disposed to be physically spaced apart from the metal screening film pattern LSP.

The first cap compensation pattern TEb_1 may include a plurality of first extension patterns TEb11_1 and TEb12_1 and a first connection pattern connecting the adjacent first extension patterns TEb11_1 and TEb12_1, and the second cap compensation pattern REb_1 may include a plurality of second extension patterns REb11_1 and REb12_1 and a second connection pattern connecting the adjacent second extension patterns REb11_1 and REb12_1. The first extension patterns TEb11_1 and TEb12_1 and the second extension patterns REb11_1 and REb12_1 may be arranged alternately to each other. For example, in the first cap compensation pattern TEb_1, the first extension pattern TEb11_1 closest to the fourth curved portion CR4 may extend in a upper right direction, the first connection pattern may extend from the end of the first extension pattern TEb11_1 extending in the upper right direction toward a lower right direction, the first connection pattern extending the lower right direction may extend in a lower left direction through the first extension pattern TEb12_1 again. In the second cap compensation pattern REb_1, the second extension pattern REb12_1 may extend in a lower left direction, the second connection pattern may extend from the end of the second extension pattern REb12 extending in the lower left direction toward an upper left direction, and the second extension pattern REb11_1 may extend from the end of the second connection pattern extending in the upper left direction toward an upper right direction again.

Figure 13:
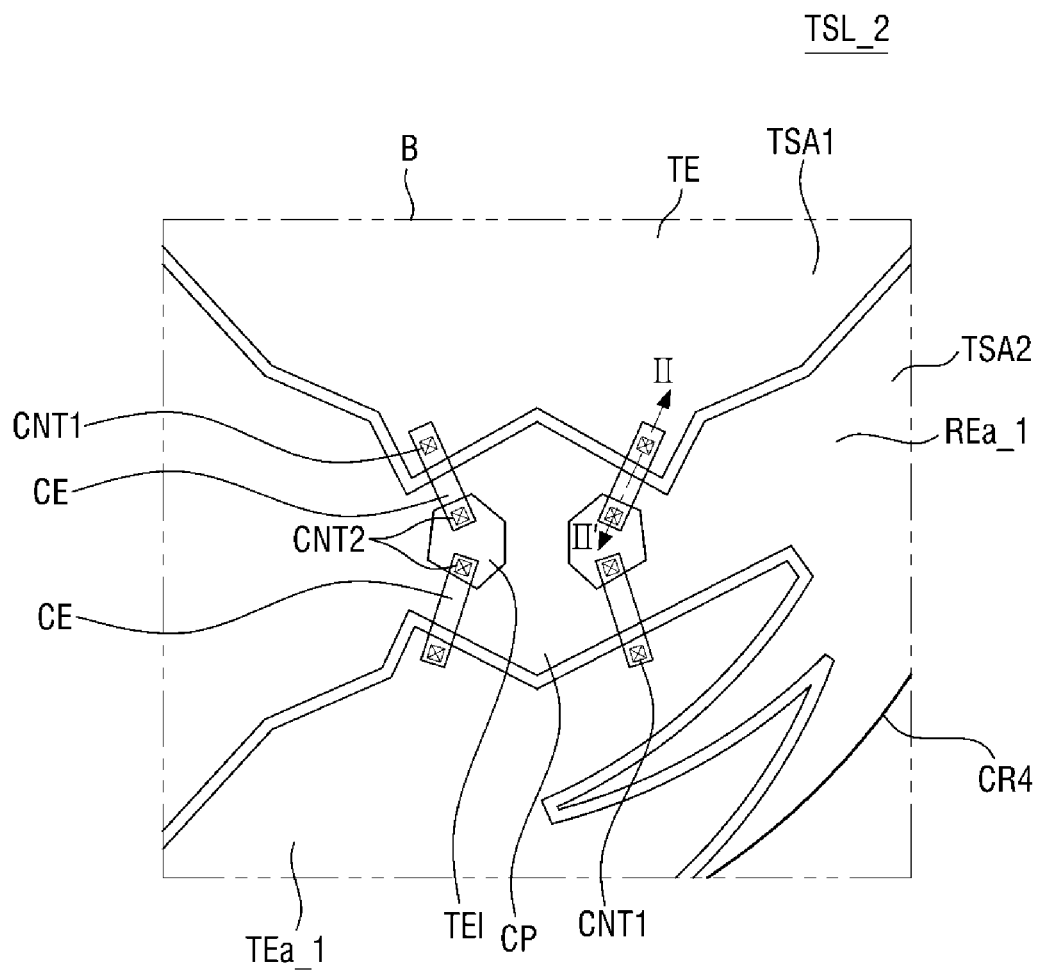
FIG. 13 is an enlarged plan view showing a touch sensor area and a touch peripheral area according to still another exemplary embodiment of the invention.

FIG. 13 is an enlarged plan view showing a touch sensor area and a touch peripheral area according to still another exemplary embodiment.

Referring to FIG. 13, a touch sensor layer TSL_2 according to the present exemplary embodiment is different from the aforementioned touch sensor layer TSL in the shapes of a first-first touch electrode TEa_1 and a second-first touch electrode REa_1.

More specifically, the first-first touch electrode TEa_1 and the second-first touch electrode REa_1 of the touch sensor layer TSL_2 may include a plurality of extension patterns extending toward each other. The plurality of extension patterns of the first-first touch electrode TEa_1 and the second-first touch electrode REa_1 may be arranged alternately to each other as shown in FIG. 13. That is, the extension pattern of the second-first touch electrode REa_1 may be disposed between the extension patterns of the first-first touch electrode TEa_1. Further, the extension pattern of the first-first touch electrode TEa_1 may be disposed between the extension patterns of the second-first touch electrode REa_1.

Figure 14:
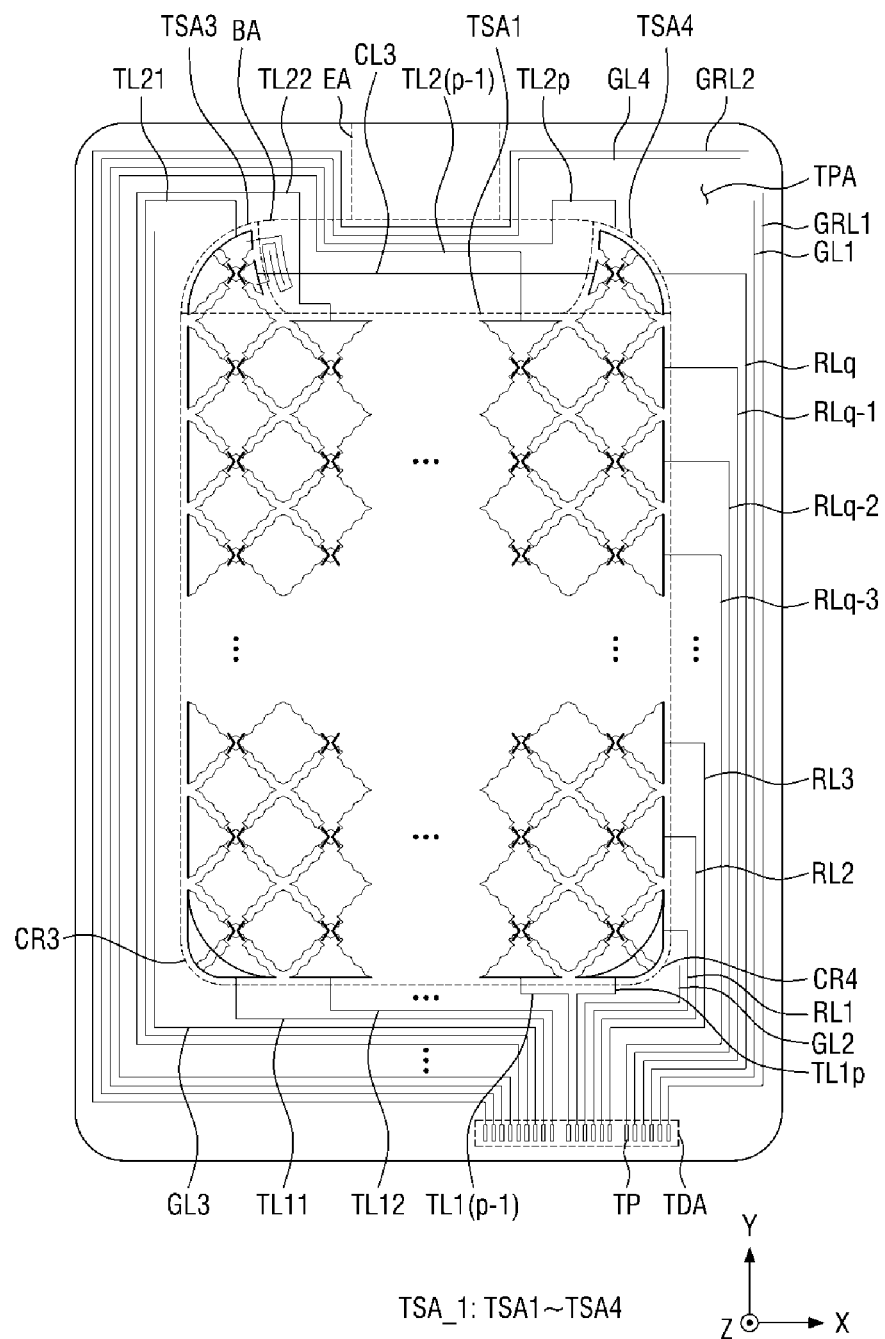
FIG. 14 is a plan view specifically showing an example of a touch sensing unit according to still another exemplary embodiment of the invention.
Figure 15:
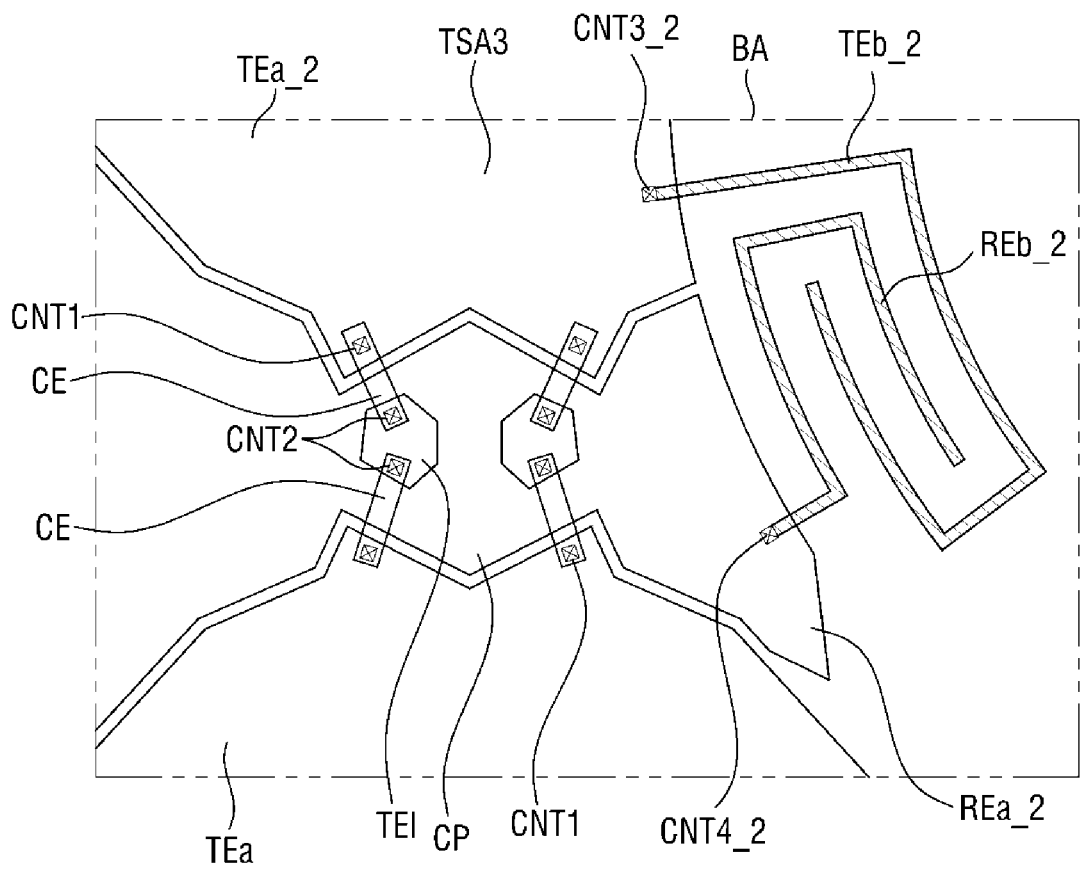
FIG. 15 is an enlarged plan view showing a touch sensor area and a touch peripheral area according to still another exemplary embodiment of the invention.

FIG. 14 is a plan view specifically showing an example of a touch sensing unit according to still another exemplary embodiment, and FIG. 15 is an enlarged plan view showing a touch sensor area and a touch peripheral area according to still another exemplary embodiment.

Referring to FIGS. 14 and 15, a touch sensing unit according to the present exemplary embodiment is different from the aforementioned touch sensing unit in that its planar shape includes a trench shape indented from one edge.

More specifically, the touch sensor area TSA_1 of the touch sensing unit according to the present exemplary embodiment may include a first touch sensor area TSA1 to a fourth touch sensor area TSA4. The first touch sensor area TSA1 may have a rectangular shape on the plane. The first touch sensor area TSA1 may occupy most of the touch sensor area TSA.

Since the second touch sensor area TSA2 is the same as that described above with reference to FIG. 5, any redundant description will be omitted.

The third touch sensor area TSA3 and the fourth touch sensor area TSA4 may protrude from one side of the first touch sensor area TSA1. The third touch sensor area TSA3 may protrude from one corner of one side of the first touch sensor area TSA1, and the fourth touch sensor area TSA4 may protrude from the other corner of one side of the first touch sensor area TSA1. Thus, the touch sensor area TSA_1 may further include an indentation area EA having a shape in which a center of one side is indented. Further, the indentation area EA may be disposed between the third touch sensor area TSA3 and the fourth touch sensor area TSA4 in the first direction (X-axis direction). The indentation area EA may have a trench shape indented from one edge of the touch sensing unit. As shown in FIG. 14, the indentation area EA may have a rectangular shape on the plane, but the inventive concepts are not limited thereto, and other shapes, such as square, V-shape, circle, and ellipse may be applied to the indentation area EA.

In the indentation area EA, some second touch signal lines TL22 to TL2p and a third connection line CL3 for connecting the second touch electrode of the third touch sensor area TSA3 to the second touch electrode of the fourth touch sensor area TSA4 may be disposed. Thus, the second touch signal lines TL22 to TL2p and the third connection line CL3 intersect each other in the planar indentation area EA, but may be disposed on different layers from each other and may be insulated from each other.

Further, since the second touch signal lines TL2 are disposed in the indentation area EA, an empty area EA may be disposed outside one side of the indentation area EA in the second direction (Y-axis direction). When the display device 10 is implemented as a mobile phone, a smart phone, a tablet personal computer, or the like, a camera device, a proximity sensor device, an illuminance sensor device, an iris recognition sensor device, or the like may be disposed to overlap the empty area EA. Thus, a separate bezel area for accommodating the camera device, proximity sensor device, illuminance sensor device, iris recognition sensor device, or the like of the mobile phone, smart phone, tablet personal computer, or the like may be omitted. Therefore, the bezel area may be reduced at one side of the mobile phone, smart phone, tablet personal computer, or the like.

The first and second touch electrodes TEa_2 and REa_2 adjacent to the indentation area EA may have a shape cut by the indentation area EA.

A plurality of cap compensation patterns TEb_2 and REb_2 may be further disposed between the planar indentation area EA and the third and fourth touch sensor areas TSA3 and TSA4. The plurality of cap compensation patterns TEb_2 and REb_2 may be electrically connected to the adjacent first and second touch electrodes TEa_2 and REa_2 through a third contact hole CNT3_2 and a fourth contact hole CNT4_2, respectively.

Since the shapes and functions of the plurality of cap compensation patterns TEb_2 and REb_2 have been described as above with reference to FIG. 12, any redundant description will be omitted.

Figure 16:
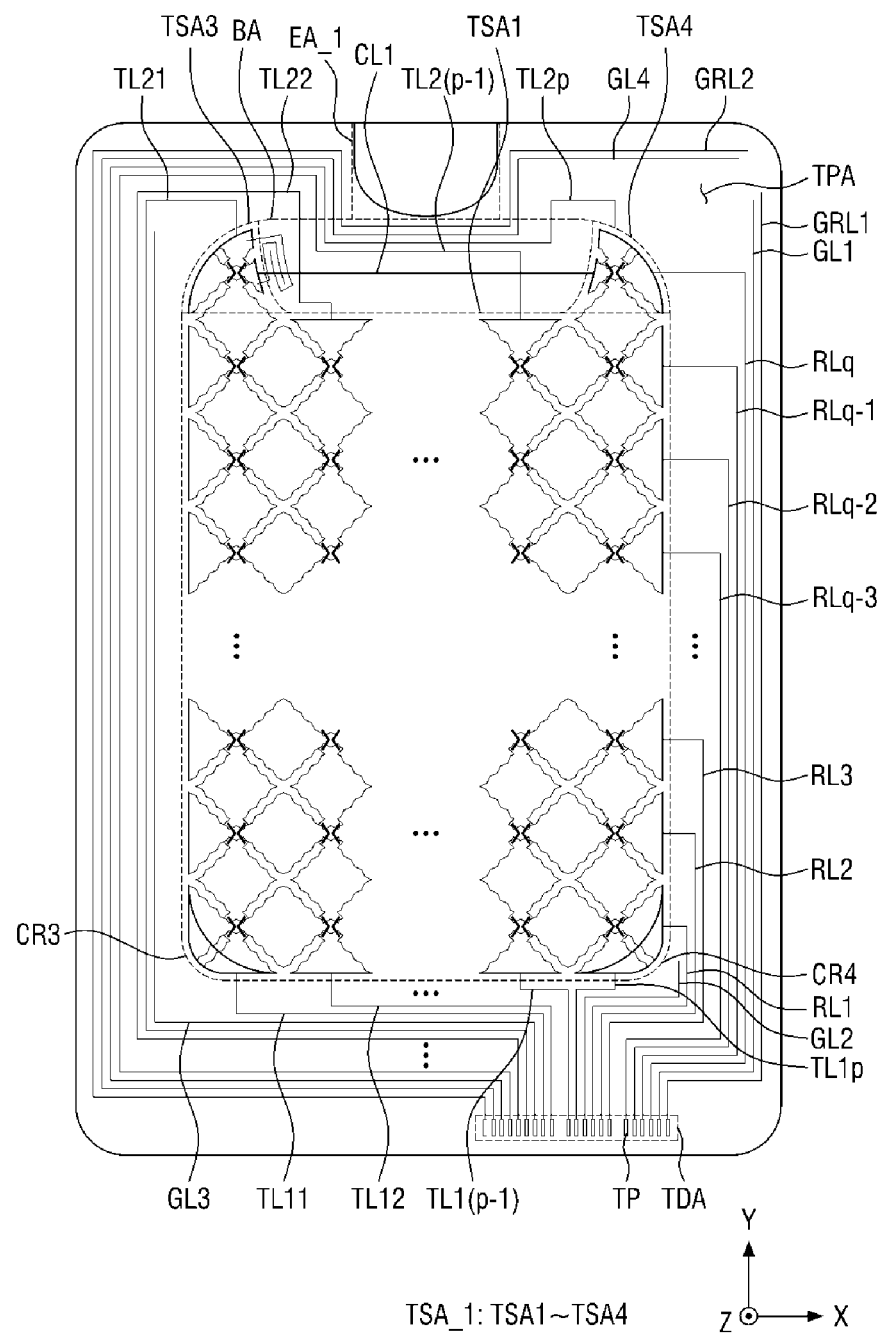
FIG. 16 is a plan view specifically showing an example of a touch sensing unit according to still another exemplary embodiment of the invention.

FIG. 16 is a plan view specifically showing an example of a touch sensing unit according to still another exemplary embodiment.

Referring to FIG. 16, a touch sensing unit according to the present exemplary embodiment is different from the touch sensing unit of FIG. 14 in that its indentation area EA_1 has a U shape or a Ω shape. Since details thereof have been described as above with reference to FIGS. 14 and 15, redundant description will be omitted.

Figure 17:
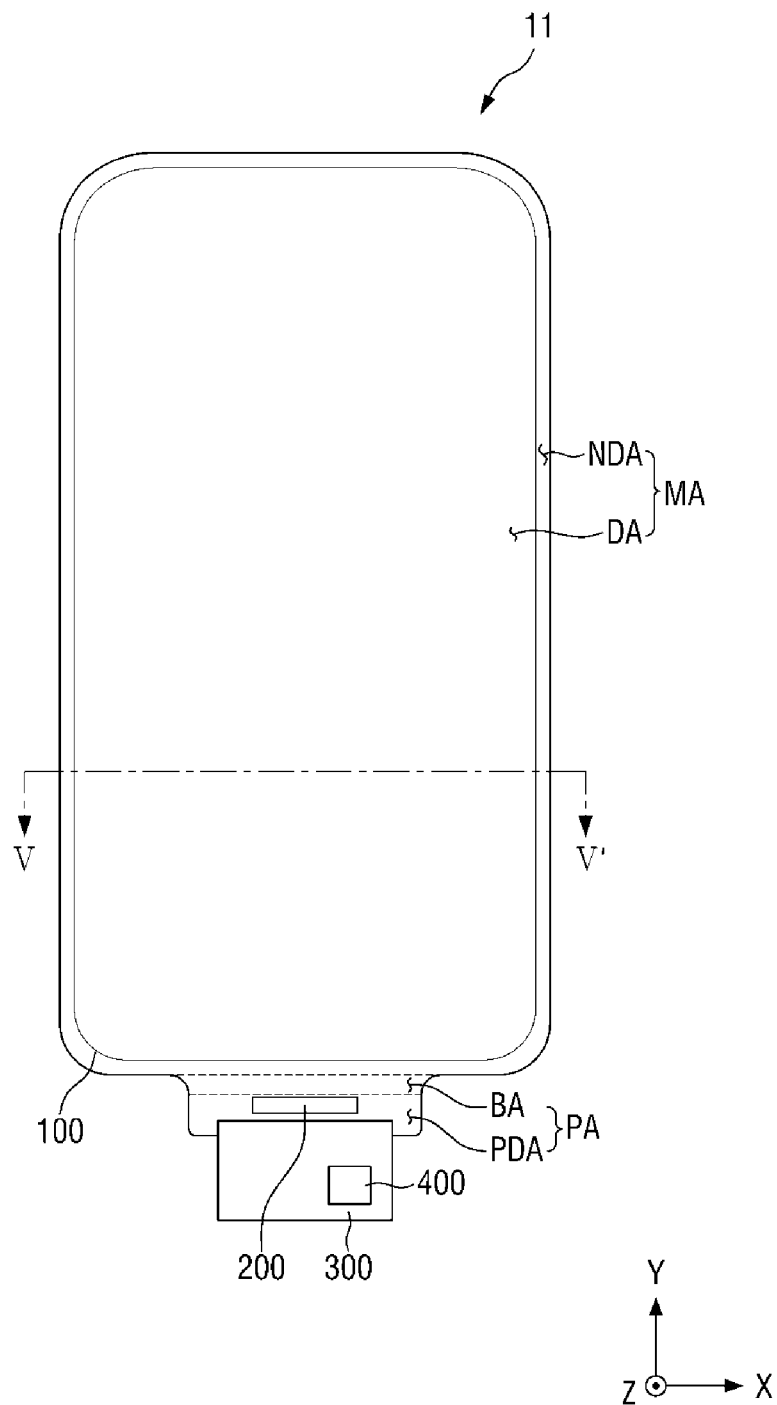
FIG. 17 is a plan view of a display device according to another exemplary embodiment of the invention.
Figure 18:
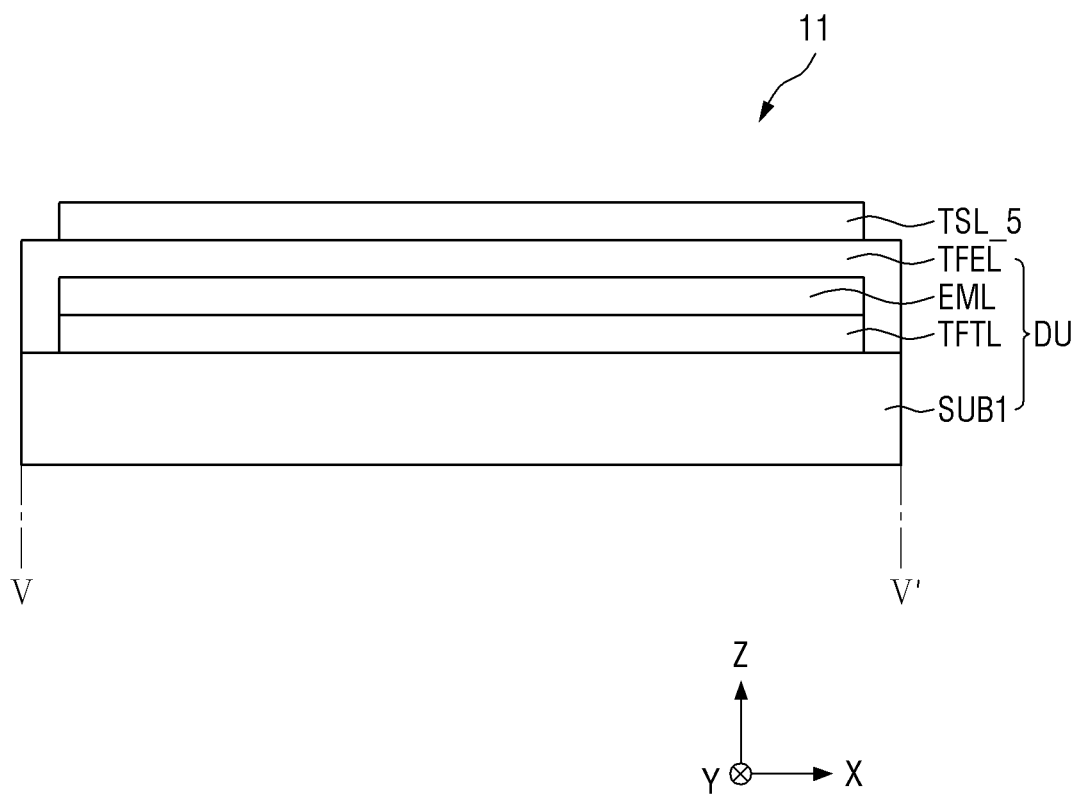
FIG. 18 is a cross-sectional view showing an example of FIG. 17.
Figure 19:
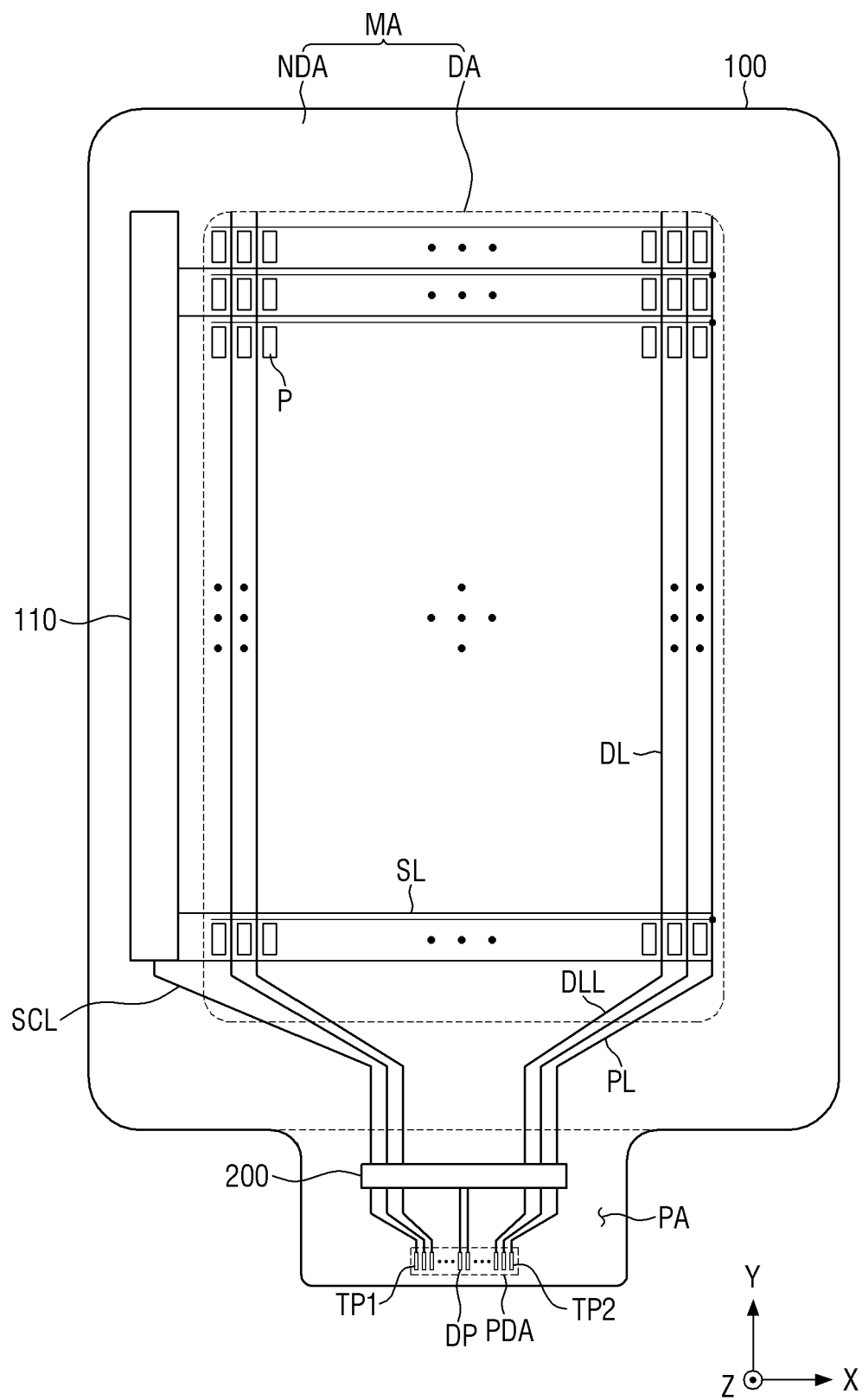
FIG. 19 is a plan view specifically showing an example of the display unit according to the embodiment of FIG. 17.
Figure 20:
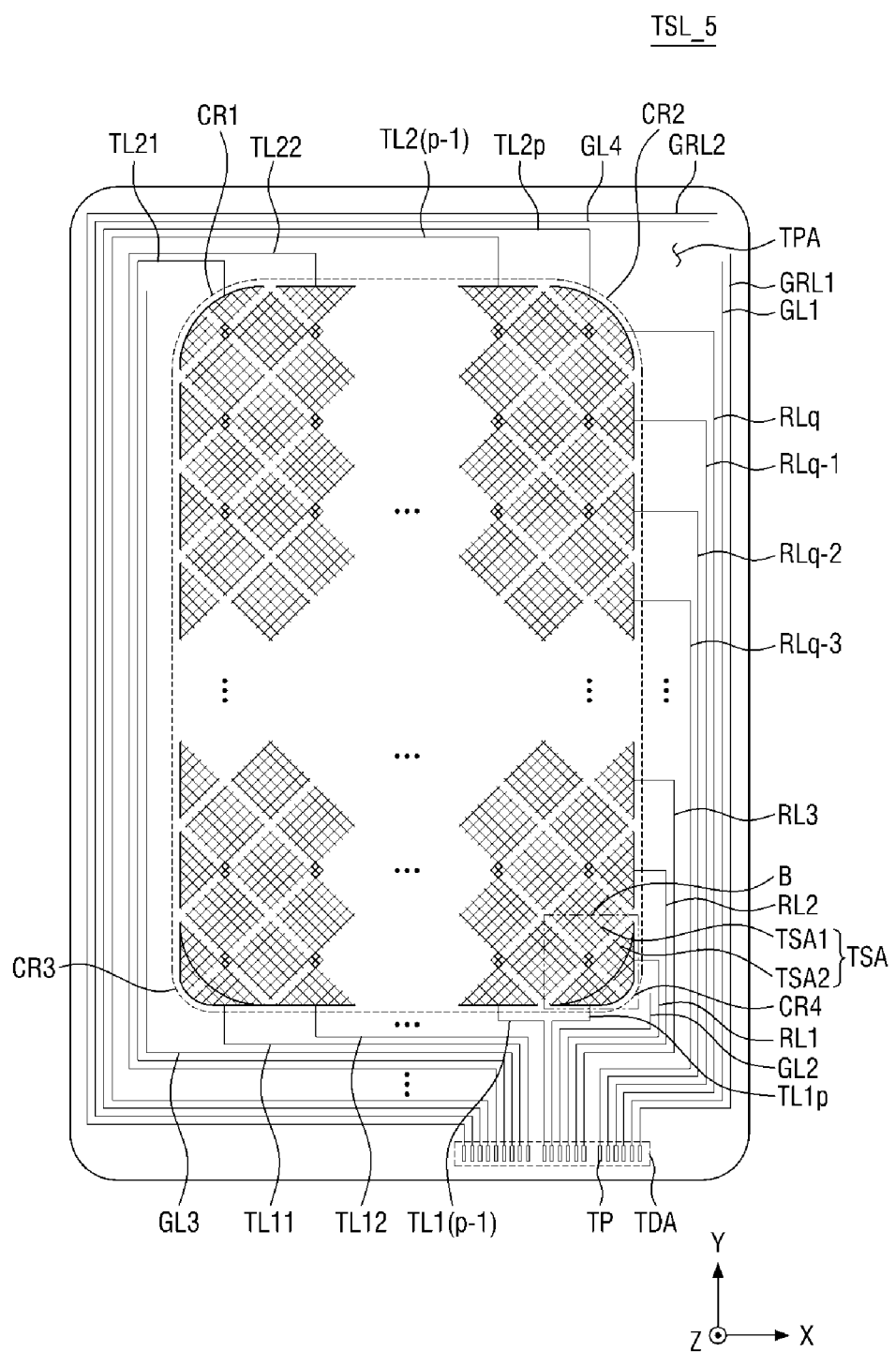
FIG. 20 is a plan view specifically showing an example of the touch sensing unit according to the embodiment of FIG. 17.
Figure 21:
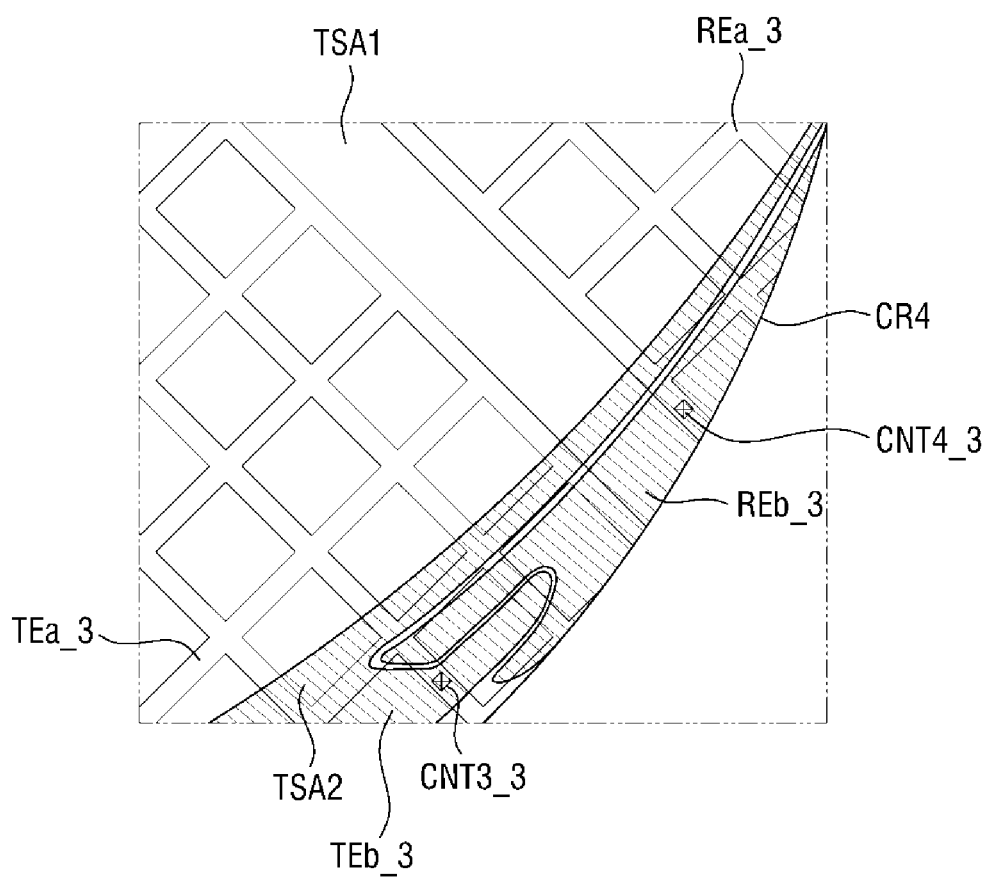
FIG. 21 is an enlarged plan view of FIG. 20.

FIG. 17 is a plan view of a display device according to another exemplary embodiment; FIG. 18 is a cross-sectional view showing an example of FIG. 17; FIG. 19 is a plan view specifically showing an example of the display unit according to the exemplary embodiment of FIG. 17; FIG. 20 is a plan view specifically showing an example of the touch sensing unit according to the exemplary embodiment of FIG. 17; and FIG. 21 is an enlarged plan view of FIG. 20.

Referring to FIGS. 17 to 21, a display device 11 according to the present exemplary embodiment is different from the aforementioned display device 10 in that its display panel 100 includes a main area MA and a protrusion area PA protruding from the main area MA.

The display device 11 according to the present exemplary embodiment includes a display panel 100, a display driving circuit 200, a circuit board 300, and a touch driving circuit 400. The display panel 100 may include a main area MA and a protrusion area PA protruding from one side of the main area MA. The main area MA may have a rectangular planar shape having short sides in a first direction (X-axis direction) and long sides in a second direction (Y-axis direction) crossing the first direction (X-axis direction). The corner where the short side in the first direction (X-axis direction) meets the long side in the second direction (Y-axis direction) may be formed to have a round shape of a predetermined curvature or have a right angle shape. The planar shape of the display device 11 is not limited to a rectangular shape, and may be formed in another polygonal shape, a circular shape, or an elliptical shape. The main area MA may be formed to be flat, but the inventive concepts are not limited thereto. The main area MA may include a curved portion formed at left and right ends thereof. In this case, the curved portion may have either a constant curvature or a variable curvature.

The main area MA may include a display area DA where pixels are formed to display an image, and a non-display area NDA which a peripheral area of the display area DA.

In the display area DA, not only pixels but also scan lines, data lines, and power supply lines, which are connected to the pixels, may be arranged. When the main area MA includes the curved portion, the display area DA may be disposed in the curved portion. In this case, the image of the display panel 100 may also be seen even on the curved portion.

The non-display area NDA may be defined as an area from the outside of the display area DA to the edge of the display panel 100. In the non-display area NDA, a scan driver for applying scan signals to scan lines, and link lines for connecting data lines to a display driving circuit 200 may be arranged.

The protrusion area PA may protrude from one side of the main area MA. For example, the protrusion area PA may protrude from the lower side of the main area MA as shown in FIG. 17. The length of the protrusion area PA in the first direction (X-axis direction) may be shorter than the length of the main area MA in the first direction (X-axis direction).

The protrusion area PA may include a bending area BA and a pad area PDA. In this case, the pad area PDA may be disposed at one side of the bending area BA, and the main area MA may be disposed at the other side of the bending area BA. For example, the pad area PDA may be disposed at the lower side of the bending area BA, and the main area MA may be disposed at the upper side of the bending area BA.

The display panel 100 may be formed to be flexible such that it is bent, warped, folded or rolled. Therefore, the display panel 100 may be bent from the bending area BA in the thickness direction (Z-axis direction). In this case, one side of the pad area PDA of the display panel 100 faces upward before the display panel 100 is bent, but one side of the pad area PDA of the display panel 100 faces downward after the display panel 100 is bent. Thus, since the pad area PDA is disposed under the main area MA, the pad area PDA may overlap the main area MA.

The pad area PDA of the display panel 100 may be provided with pads electrically connected to the display driving circuit 200 and the circuit board 300. The pads may include display pads electrically connected to the display driving circuit 200 and touch pads electrically connected to touch lines.

The touch driving circuit 400 may be disposed on the circuit board 300. The touch driving circuit 400 may be formed as an integrated circuit (IC) and mounted on the circuit board 300.

As shown in FIG. 18, in the display device 11 according to the present exemplary embodiment, a second substrate SUB2 is omitted, and a touch sensor layer TSL_5 may be disposed on a thin film encapsulation layer TFEL.

The thin film encapsulation layer TFEL may be disposed in both the display area DA and the non-display area NDA. Specifically, the thin film encapsulation layer TFEL may be disposed to cover the thin film transistor layer TFTL and the light emitting element layer EML in the display area DA and the non-display area NDA.

The touch sensor layer TSL_5 may be disposed on the thin film encapsulation layer TFEL. Since the touch sensor layer TSL_5 is disposed directly on the thin film encapsulation layer TFEL, there is an advantage that the thickness of the display device 11 may be reduced, compared to when a separate touch panel including the touch sensor layer TSL_5 is attached onto the thin film encapsulation layer TFEL.

Referring to FIGS. 19 and 20, display electrode pads DP and touch electrode pads TP1 and TP2 may be arranged in the pad area PDA of the protrusion area PA of the display panel 100, and touch electrodes TE and RE may be arranged in a mesh form.

The display electrode pads DP may be disposed at one end of the protrusion area PA of the display panel 100. The first touch electrode pads TP1 may be disposed at the left side of the display electrode pads DP, and the second touch electrode pads TP2 may be disposed at the right side of the display electrode pads DP.

The driving electrodes TE and the sensing electrodes RE may be formed as mesh type electrodes. When the touch sensor layer TSL_5 including the driving electrodes TE and the sensing electrodes RE is formed directly on the thin film encapsulation film TFEL, a very large parasitic capacitance may be formed between the second electrode of the light emitting element layer EML and the driving electrode TE or sensing electrode RE of the touch sensor layer TSL_5 because the distance between the second electrode of the light emitting element layer EML and the driving electrodes TE or sensing electrodes RE of the touch sensor layer TSL_5 is close. Therefore, in order to reduce the parasitic capacitance, it is preferable that the driving electrodes TE and the sensing electrodes RE are formed as mesh type electrodes as compared with a case where they are formed as non-patterned electrodes of a transparent oxide conductive layer including ITO or IZO.

The adjacent first and second touch electrodes TEa_3 and REa_3 may have a shape cut by the fourth curved portion CR4 of the touch sensing unit.

Even in the present exemplary embodiment, a plurality of cap compensation patterns TEb_3 and REb_3 may be further disposed in the second touch sensor area TSA2, and the plurality of cap compensation patterns TEb_3 and REb_3 may be electrically connected to the adjacent first and second touch electrodes TEa_3 and REa_3 through the third contact hole CNT3_3 and the fourth contact hole CNT4_3, respectively. Since the shapes and functions of the cap compensation patterns TEb_3 and REb_3 have been described as above with reference to FIGS. 8 to 10, redundant description will be omitted.

Figure 22:
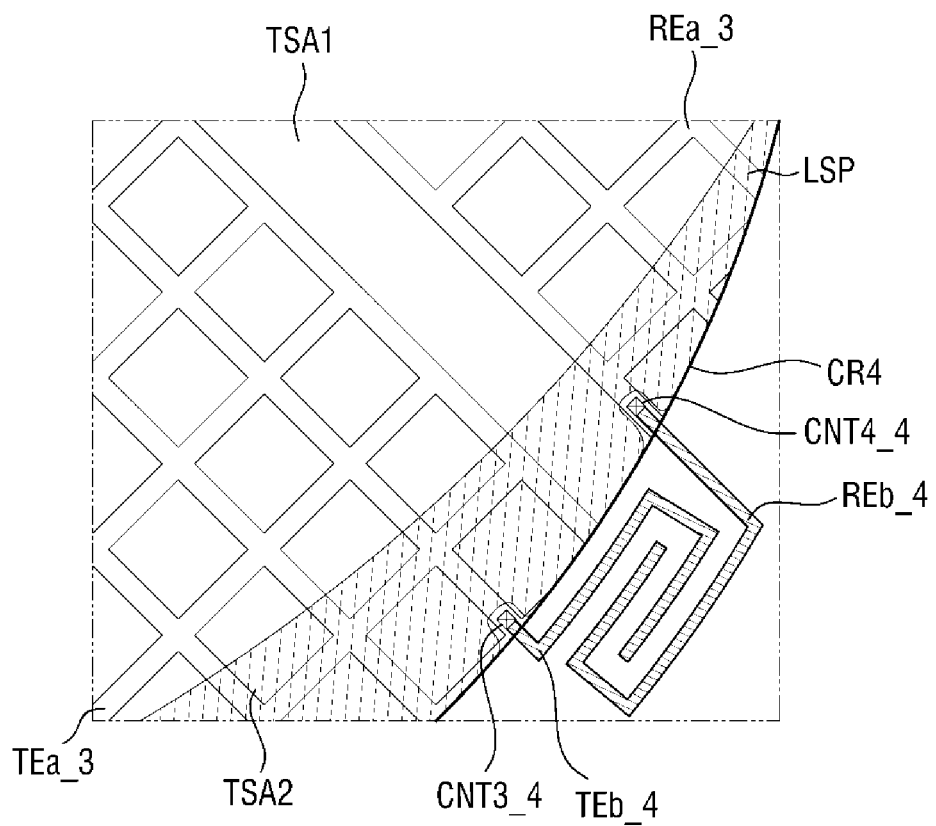
FIG. 22 is an enlarged plan view showing a touch sensor area and a touch peripheral area according to still another exemplary embodiment of the invention.

FIG. 22 is an enlarged plan view showing a touch sensor area and a touch peripheral area according to still another exemplary embodiment.

Referring to FIG. 22, a touch sensor layer TSL_6 according to the present exemplary embodiment is different from the touch sensor layer TSL_5 of FIGS. 17 to 21 in that a plurality of cap compensation patterns TEb_4 and REb_4 substantially the same as the plurality of cap compensation patterns TEb_1 and REb_1 of FIG. 12 are provided instead of the plurality of cap compensation patterns TEb_3 and REb_3 of FIGS. 17 to 21.

The plurality of cap compensation patterns TEb_4 and REb_4 may be electrically connected to the adjacent first and second touch electrodes TEa_4 and REa_4 through the third contact hole CNT3_4 and the fourth contact hole CNT4_4, respectively. Since the shapes and functions of the cap compensation patterns TEb_4 and REb_3 have been described as above with reference to FIG. 12, any redundant description will be omitted.

Figure 23:
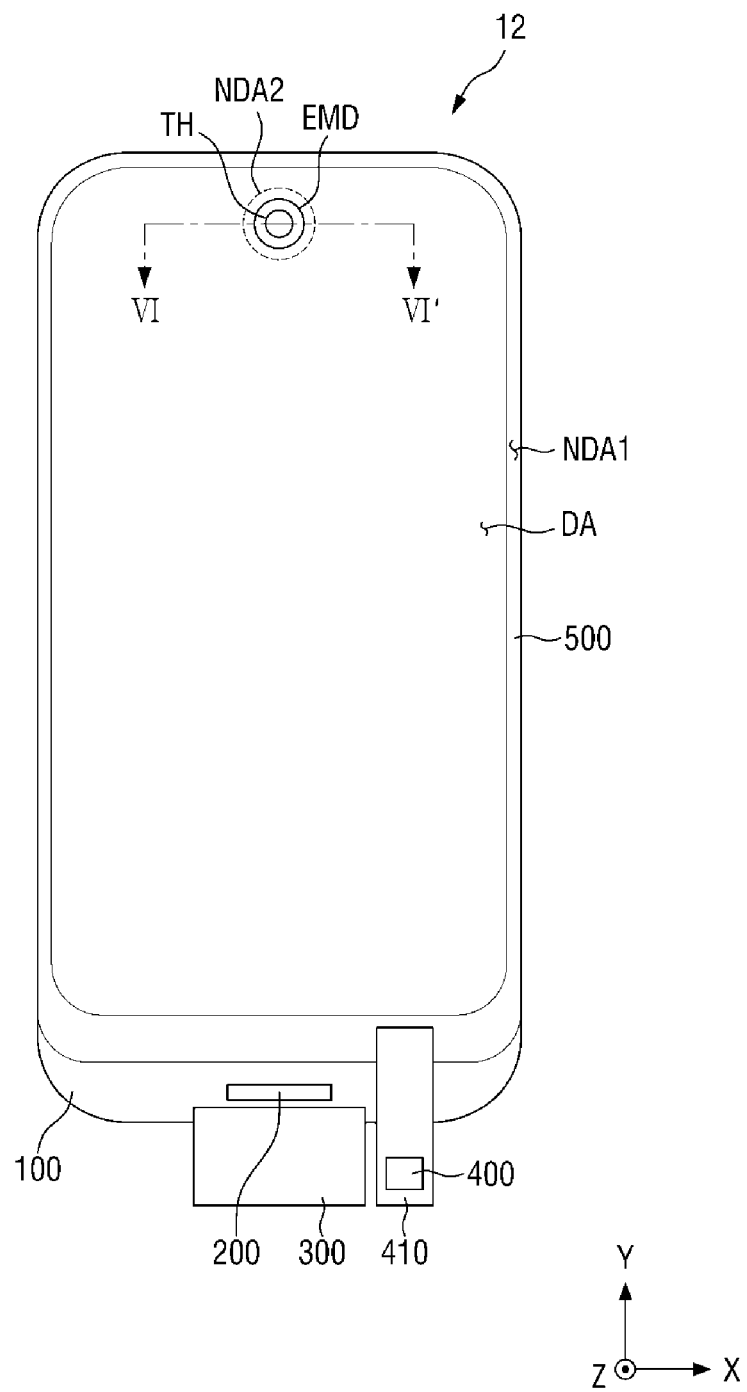
FIG. 23 is a plan view of a display device according to still another exemplary embodiment of the invention.
Figure 24:
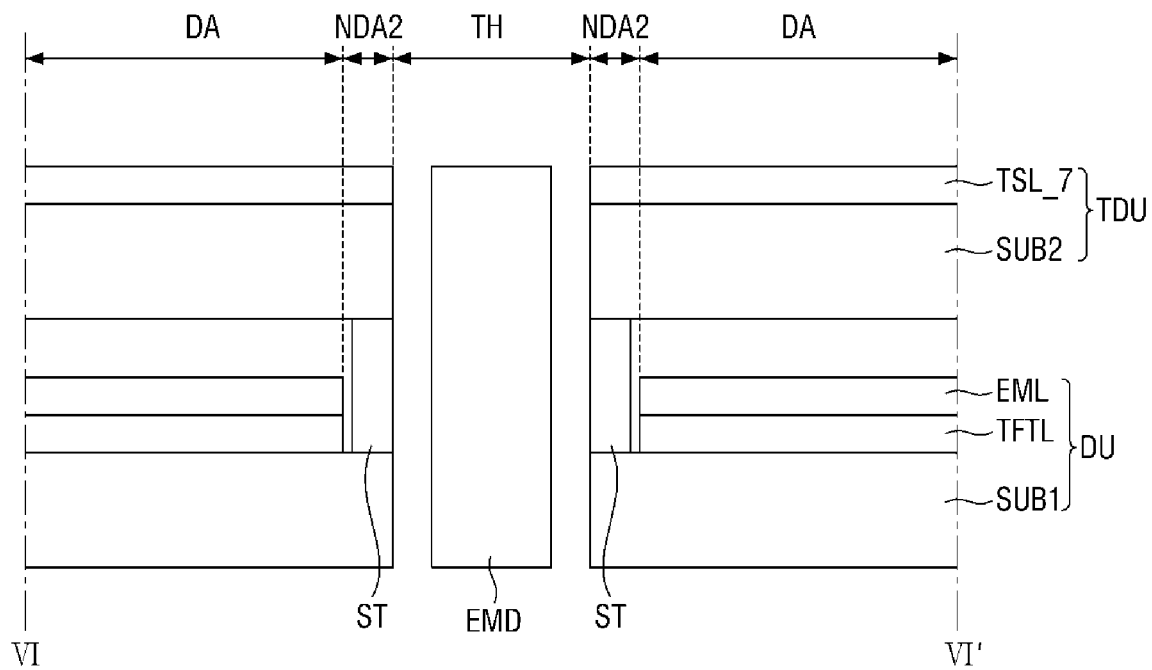
FIG. 24 is a cross-sectional view showing an example of FIG. 23.
Figure 25:
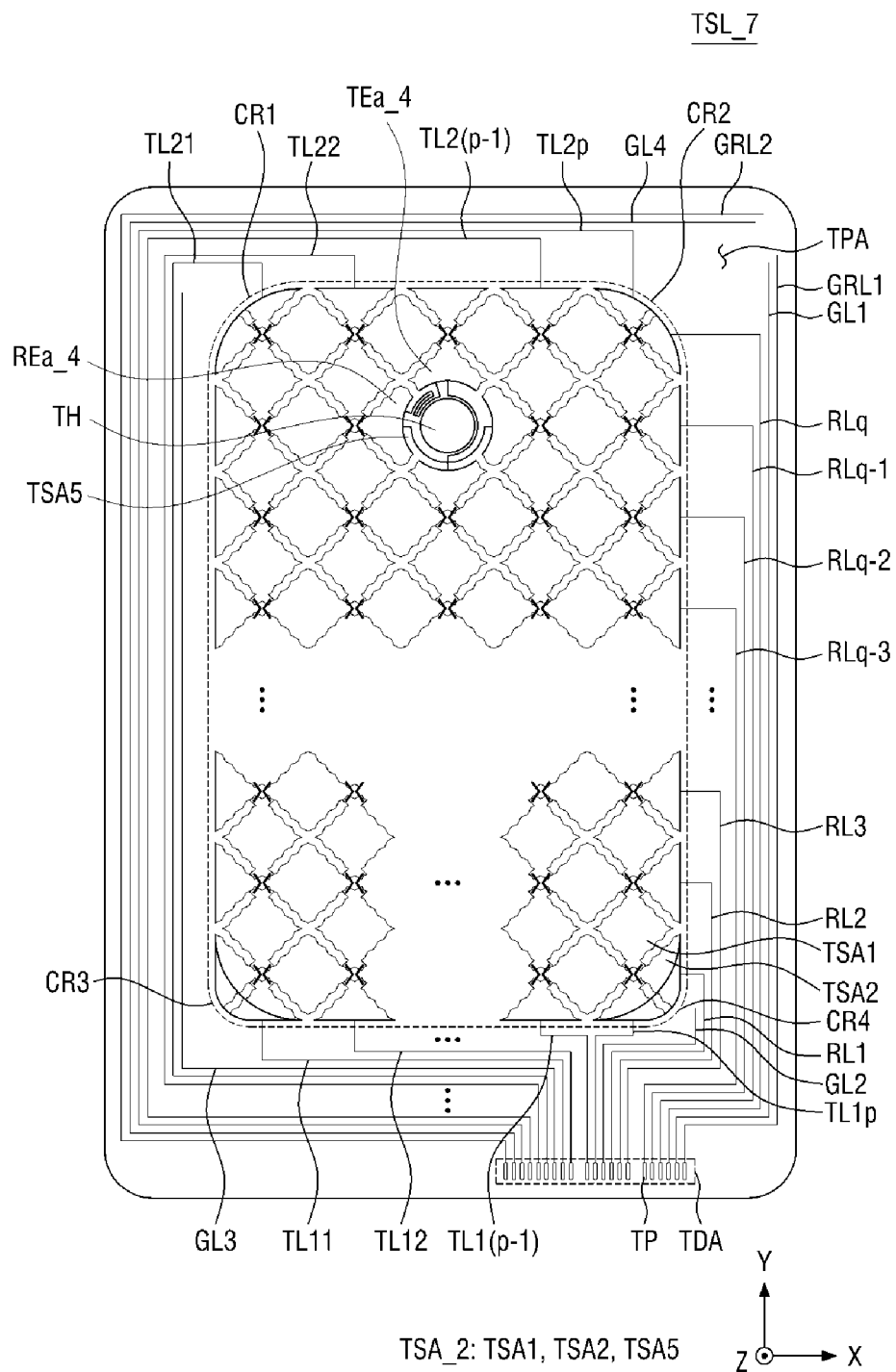
FIG. 25 is a plan view specifically showing an example of the touch sensing unit according to the exemplary embodiment of FIG. 23.
Figure 26:
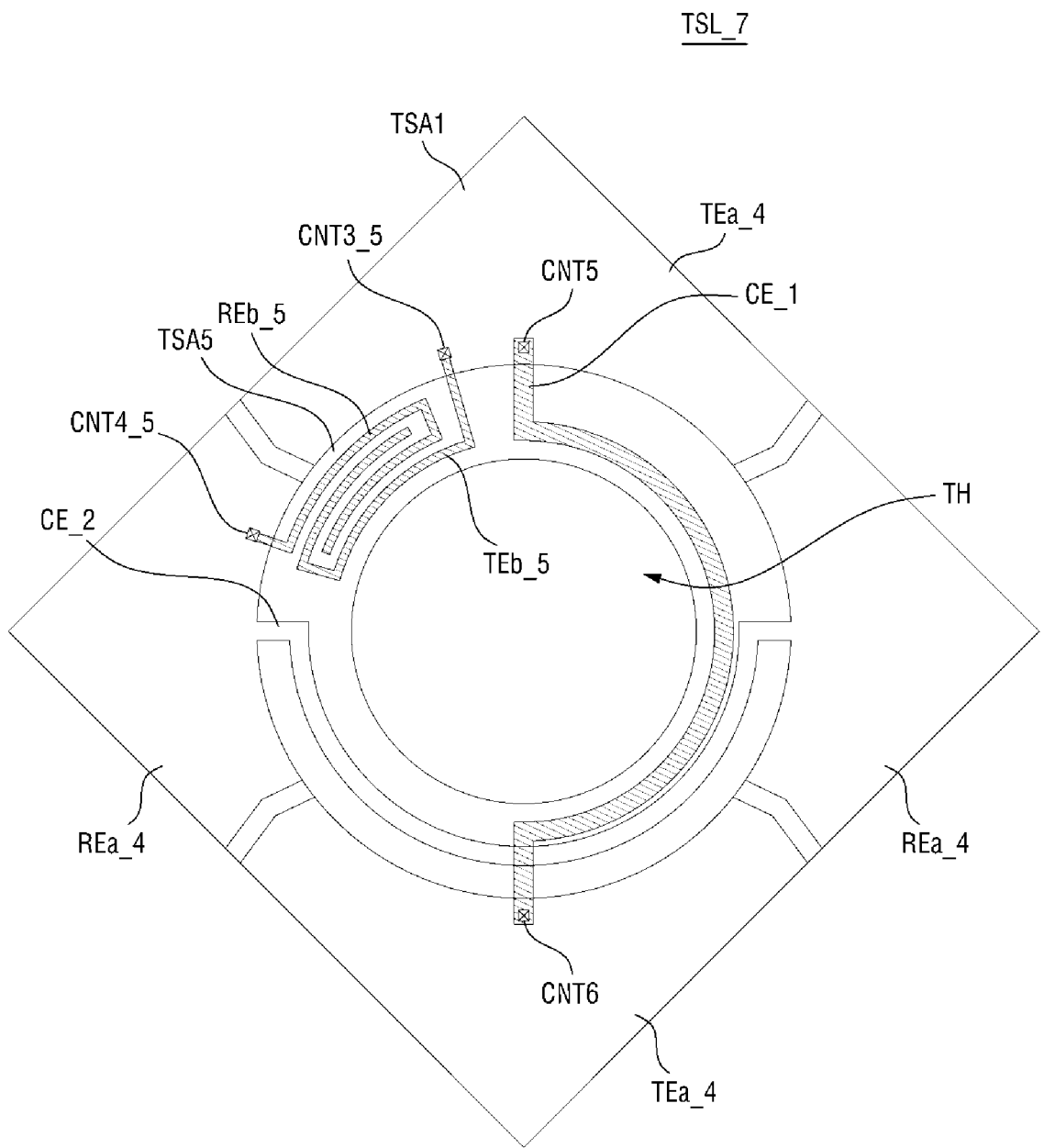
FIG. 26 is an enlarged plan view of FIG. 25.

FIG. 23 is a plan view of a display device according to still another exemplary embodiment; FIG. 24 is a cross-sectional view showing an example of FIG. 23; FIG. 25 is a plan view specifically showing an example of the touch sensing unit according to the exemplary embodiment of FIG. 23; and FIG. 26 is an enlarged plan view of FIG. 25.

Referring to FIGS. 23 to 26, a display device 12 according to the present exemplary embodiment is different from the aforementioned display device 10 in that it includes a display area DA including a plurality of pixels, and first and second non-display areas NDA1 and NDA2 disposed around the display area DA and not displaying an image.

Since details of the display area DA and the first non-display area NDA1 have been described as above with reference to FIG. 17, any redundant description will be omitted.

In the display device 12 according to the present exemplary embodiment, a through pattern may include a through-hole TH, the through-hole TH may penetrate the display device 12 along the third direction (Z-axis direction), and an electronic element EMD may be disposed in the through-hole TH.

In some embodiments, as shown in the drawings, the planar shape of the through-hole TH may be a circular shape, but is not limited thereto. The planar shape of the through-hole TH may be variously modified, such as a polygon, a combination of straight lines and curves, and an ellipse.

The second non-display area NDA2 of the display device 12 may surround the through-hole TH in a plan view. The display area DA may surround the second non-display area NDA2 in a plan view.

In the laminated structure, the display unit DU and touch sensing unit TDU of the display device 12 may not be disposed in the region of the through-hole TH, and may be disposed in a part of the second non-display area NDA2. The display unit DU may be located between the first substrate SUB1 and the second substrate SUB2 in the second non-display area NDA2, and may further include a hole sealing member ST entirely surrounding the through-hole TH in a plan view.

The touch sensing unit TU may further include a fifth touch sensor area TSA5 overlapping the second non-display area NDA2. That is, the fifth touch sensor area TSA5 may be located between the first touch sensor area TSA1 and the through-hole TH in a plan view. The fifth touch sensor area TSA5 may be completely surrounded by the first touch sensor area TSA1 and the through-hole TH in a plan view.

The first and second touch electrodes TEa_4 and REa_4 adjacent to the second non-display area NDA2 may have a shape cut by the second non-display area NDA2.

A plurality of cap compensation patterns TEb_5 and REb_5 may be further provided in the fifth touch sensor area TSA5. The plurality of cap compensation patterns TEb_5 and REb_5 may be electrically connected to the adjacent first and second touch electrodes TEa_5 and REa_5 through the third contact hole CNT3_5 and the fourth contact hole CNT4_5, respectively. Since the shapes and functions of the cap compensation patterns TEb_5 and REb_5 have been described as above with reference to FIG. 12, any redundant description will be omitted.

Figure 27:
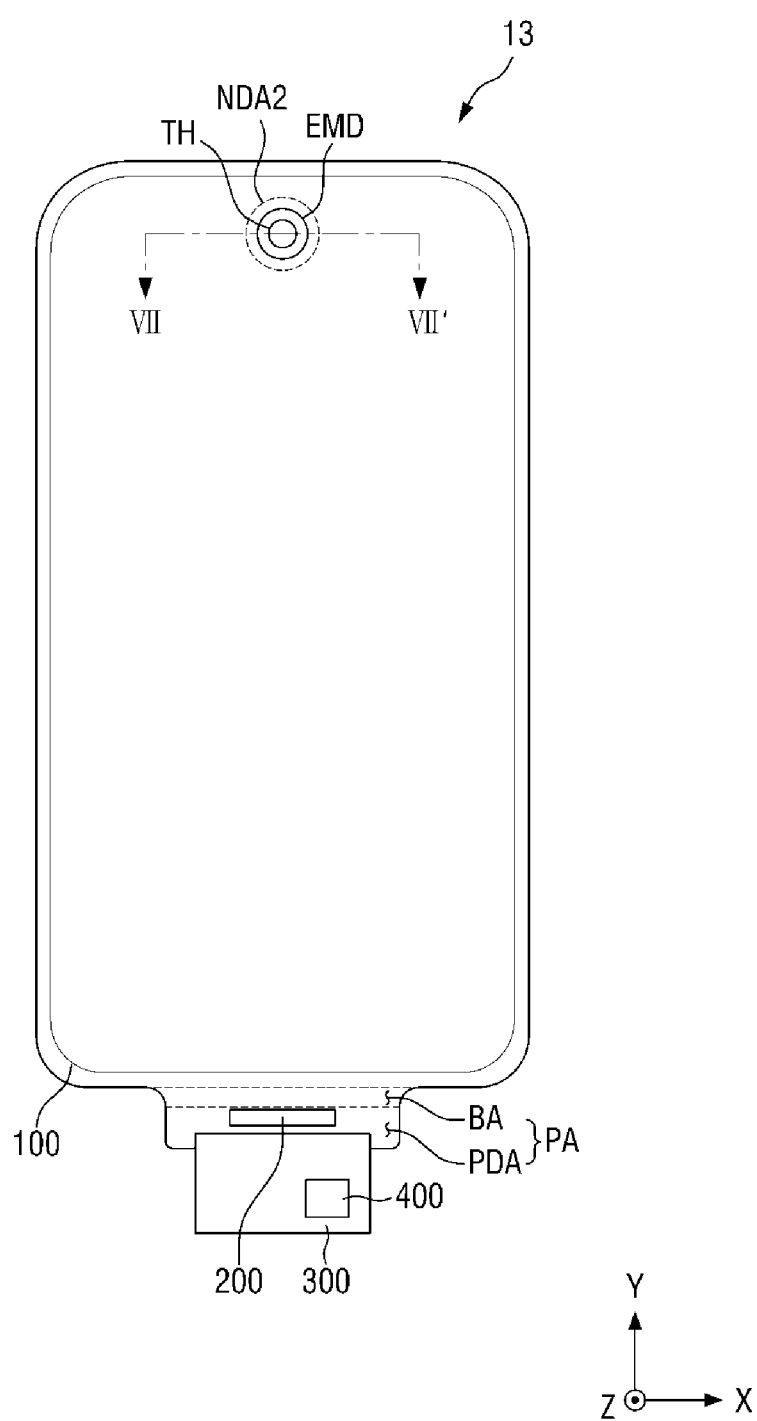
FIG. 27 is a plan view of a display device according to still another exemplary embodiment of the invention.
Figure 28:
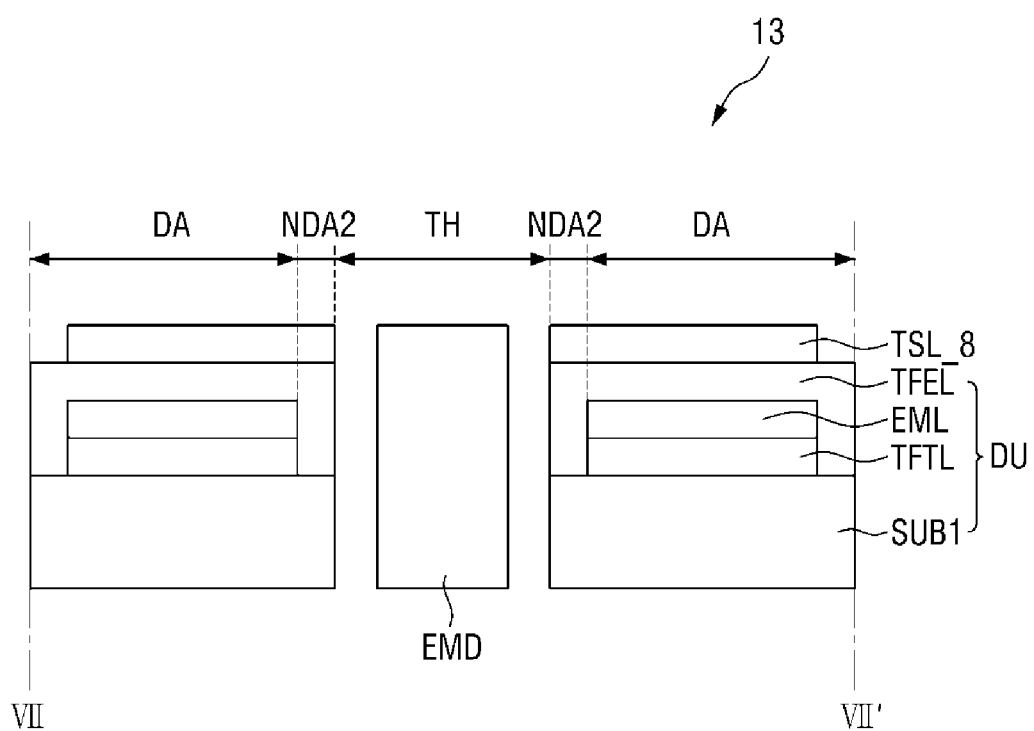
FIG. 28 is a cross-sectional view showing an example of FIG. 27.
Figure 29:
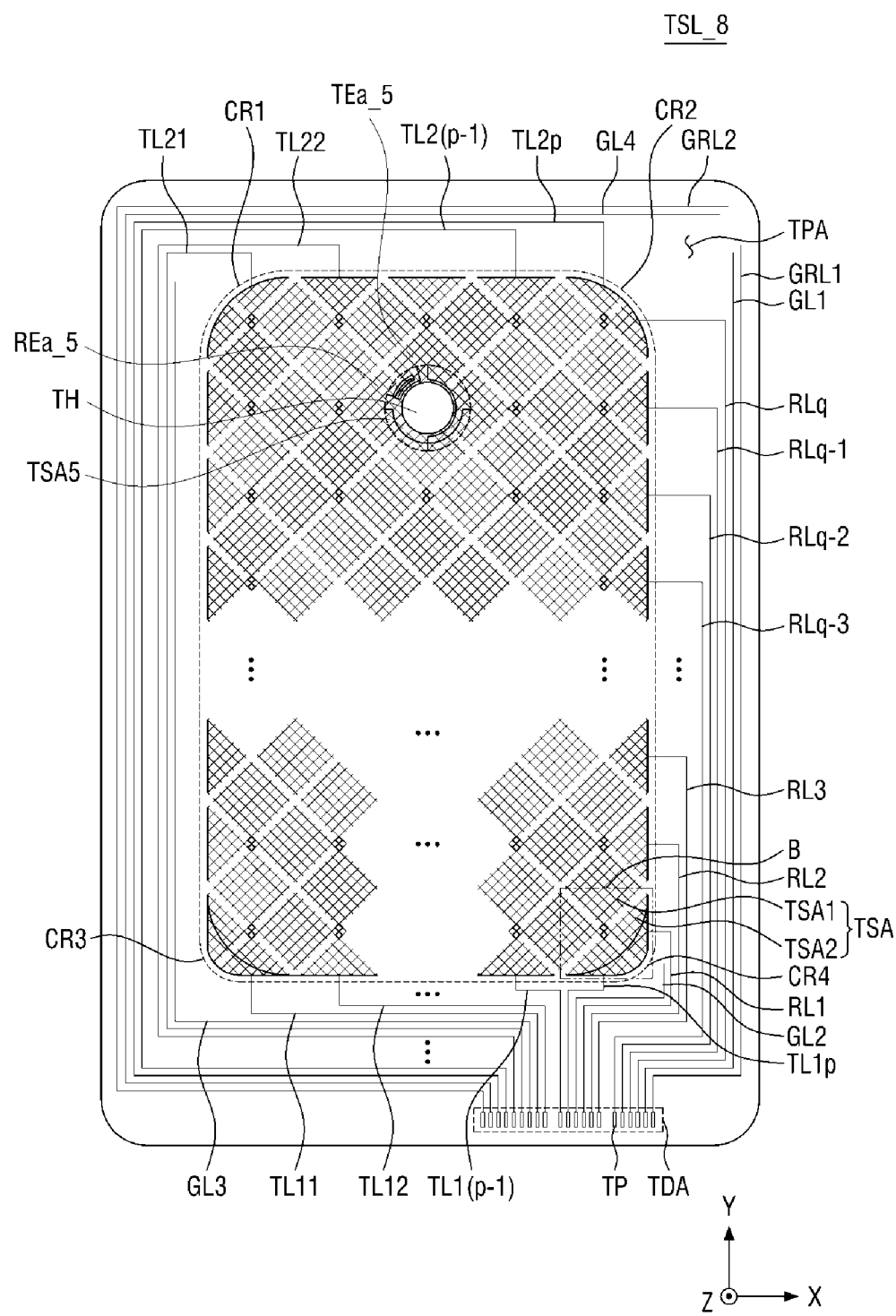
FIG. 29 is a plan view specifically showing an example of the touch sensing unit according to the embodiment of FIG. 27.
Figure 30:
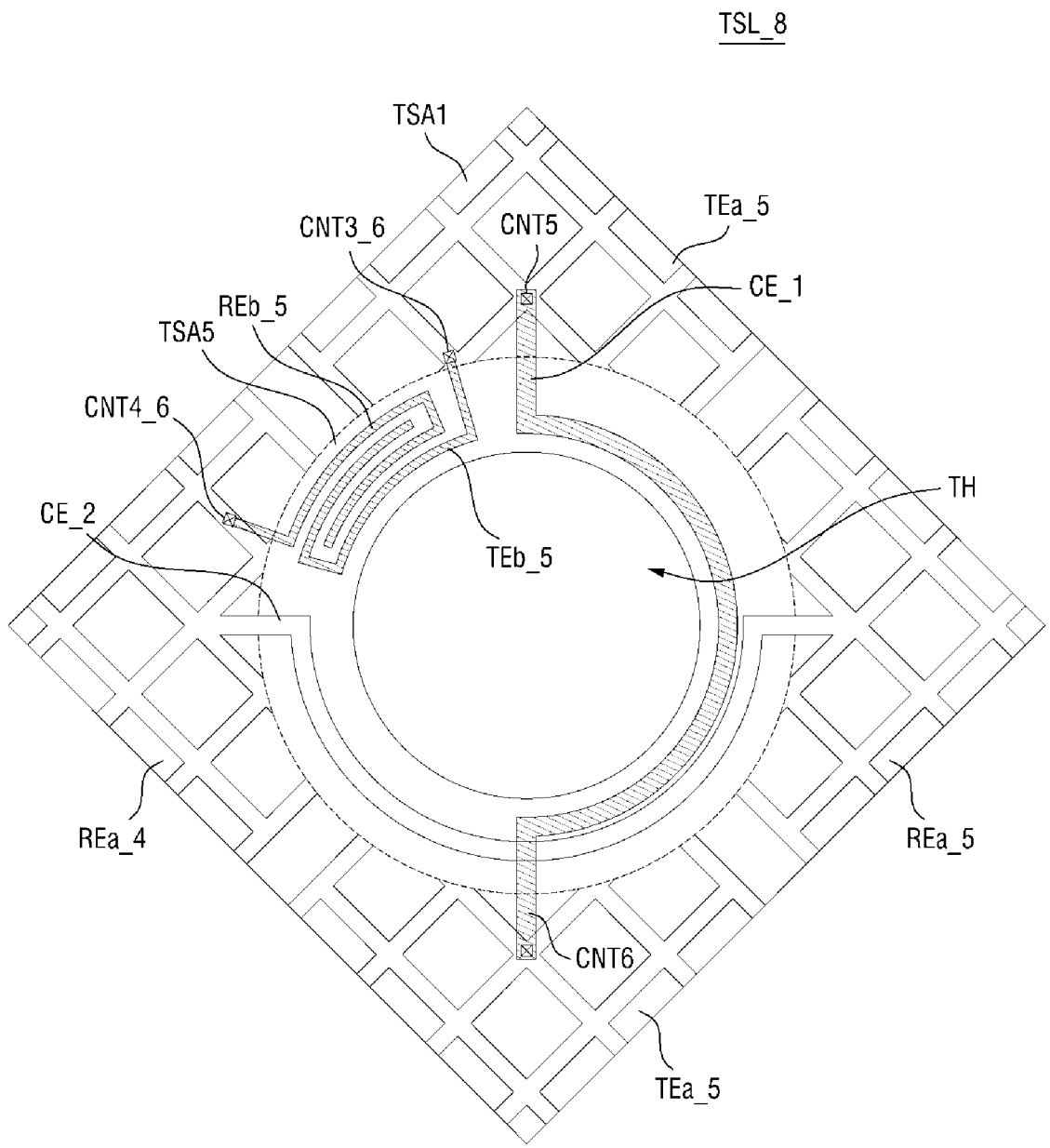
FIG. 30 is an enlarged plan view of FIG. 29.

FIG. 27 is a plan view of a display device according to still another exemplary embodiment; FIG. 28 is a cross-sectional view showing an example of FIG. 27; FIG. 29 is a plan view specifically showing an example of the touch sensing unit according to the exemplary embodiment of FIG. 27; and FIG. 30 is an enlarged plan view of FIG. 29.

Referring to FIGS. 27 to 30, a display device 13 according to the present exemplary embodiment is different from the aforementioned display device 11 of FIGS. 17 to 21 in that it further includes the through-hole TH described with reference to FIGS. 23 to 26.

Figure 31:
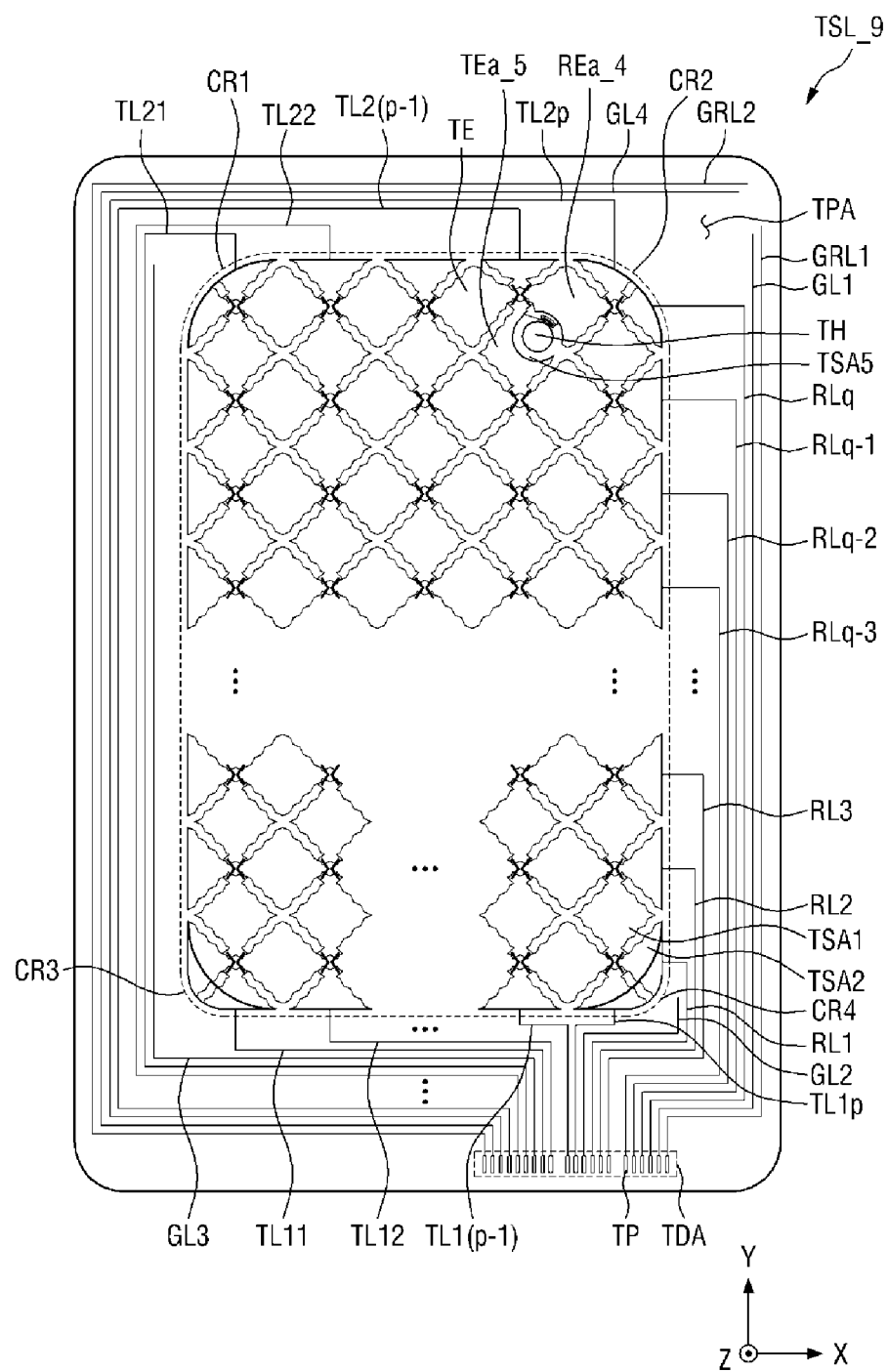
FIG. 31 is a plan view of a touch sensing unit according to still another exemplary embodiment of the invention.
Figure 32:
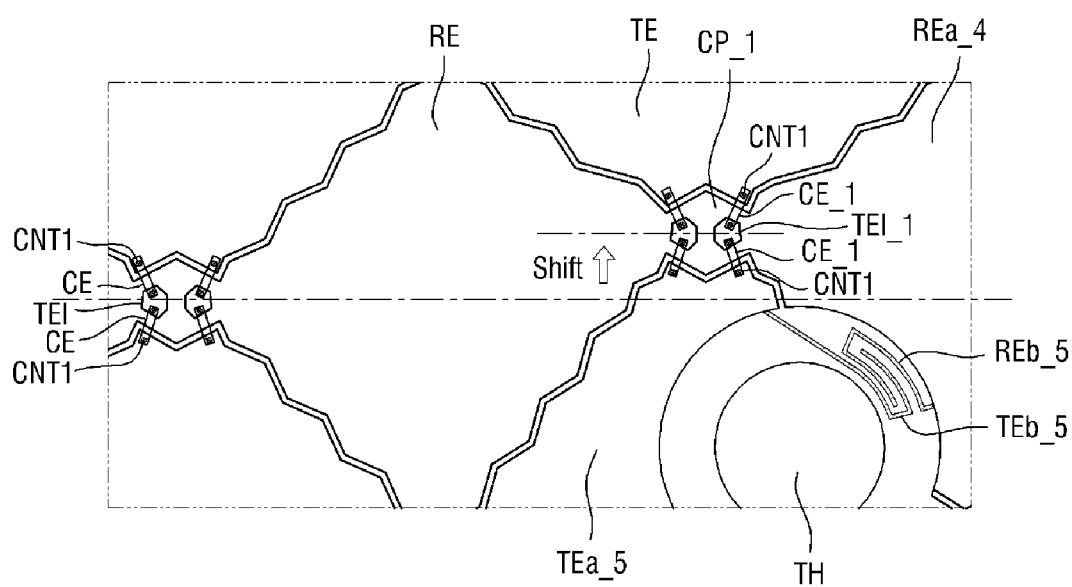
FIG. 32 is an enlarged plan view of a part of FIG. 31.

FIG. 31 is a plan view of a touch sensing unit according to still another embodiment, and FIG. 32 is an enlarged plan view of a part of FIG. 31.

Referring to FIGS. 31 and 32 together with FIGS. 23 and 24, a touch sensing unit according to the present exemplary embodiment may further include a fifth touch sensor area TSA5 overlapping the second non-display area NDA2. That is, the fifth touch sensor area TSA5 may be located between the first touch sensor area TSA1 and the through-hole TH in a plan view. The fifth touch sensor unit TSA5 may be completely surrounded by the first touch sensor area TSA1 and the through-hole TH in a plan view.

The first and second touch electrodes TEa_5 and REa_4 adjacent to the second non-display area NDA2 may have a shape cut by the second non-display area NDA2.

A plurality of cap compensation patterns TEb_5 and REb_5 may be further provided in the fifth touch sensor area TSA5. The plurality of cap compensation patterns TEb_5 and REb_5 may be electrically connected to the adjacent first and second touch electrodes TEa_5 and REa_4 through the third contact holes, respectively. Since the shapes and functions of the cap compensation patterns TEb_5 and REb_5 have been described as above with reference to FIGS. 12, 25, and 26, any redundant description will be omitted.

A touch sensor layer TSL_9 according to the present exemplary embodiment in which the through-hole TH is disposed between the first touch electrode TEa_5 and the second touch electrode REa_4, each having a cut shape in a plan view, is different from the touch sensor layer TSL_7 of FIGS. 25 and 26 in which the though hole TH is disposed between the first touch electrodes TEa_4 adjacent to each other along the second direction y and between the second touch electrodes REa_4 adjacent to each other along the first direction x. As shown in FIG. 31, the through-hole TH according to the present exemplary embodiment may be disposed between one first touch electrode TEa_5 and one second touch electrode REa_4, and may not be disposed adjacent to the touch electrodes TE and RE other than the one first touch electrode TEa_5 and the one second touch electrode REa_4.

That is, the through-hole TH of the touch sensor layer TSL_9 may be disposed between the first touch electrode TEa_5 and the second touch electrode REa_4 in a plan view, and may not be disposed between the first touch electrodes TEa_5 and TE adjacent to each other along the second direction y and between the second touch electrodes REa_4 and RE adjacent to each other along the first direction x in a plan view. Thus, connection electrodes for electrically connecting the adjacent first touch electrodes TEa_4 to the adjacent second touch electrodes REa_4, having been described with reference to FIGS. 25 and 26, may be omitted.

The through-hole TH according to the present exemplary embodiment may be adjacent to an edge side of the upper right end of the rhombic first touch electrode TEa_5 and an edge side of the lower left end of the rhombic second touch electrode REa_4. The through-hole TH may be disposed between the edge side of the upper right end of the first touch electrode TEa_5 and the edge side of the lower left end of the second touch electrode REa_4.

The fifth touch sensor area TSA5 may surround the through-hole TH in a plan view. Similarly, the fifth touch sensor area TSA5 may be disposed adjacent to an edge side of the upper right end of the rhombic first touch electrode TEa_5 and an edge side of the lower left end of the rhombic second touch electrode REa_4. Further, the fifth touch sensor area TSA5 may be disposed between the edge side of the upper right end of the first touch electrode TEa_5 and the edge side of the lower left end of the second touch electrode REa_4 in a plan view.

As described above with reference to FIG. 6, the first touch electrodes TE disposed adjacent to each other along the second direction y may be electrically connected to each other through the first touch island electrode TE1 and the connection electrode CE for connecting the first touch electrode TE and the first touch island electrode TE.

Even in FIGS. 31 and 32, similarly, the first touch electrodes TE and TEa_5 disposed adjacent to each other along the second direction y may be electrically connected to each other through a first touch island electrode TE1_1 and a connection electrode CE_1 for connecting the first touch electrodes TE and TEa_5 and the first touch island electrode TE_1. Since the first touch island electrode TE1_1 and the connection electrode CE_1 to be additionally described is the same as the first touch island electrode TE1 and the connection electrode CE having been described with reference to FIG. 6 in terms of function and layout relationship with the adjacent first touch electrodes TE and TEa_5, a redundant description will be omitted.

In order for the first touch island electrode TE1_1 and the connection electrode CE_1 to interfere with the through-hole disposed adjacent to an edge side of the upper right end of the rhombic first touch electrode TEa_5, the first touch island electrode TE1_1 and the connection electrode CE_1 may be disposed to be shifted in the second direction y from the first touch island electrode TE1 and the connection electrode CE adjacent to each other in the first direction x. That is, as shown in FIG. 32, the first touch island electrode TE1_1 disposed between the first touch electrodes TE and TEa_5 may be disposed above the first touch island electrode TE1 disposed between the first touch electrodes TE adjacent to each other along the second direction y. As described above with reference to FIG. 6, a plurality of first touch island electrode TE1_1 may be disposed between the first touch electrodes TE and TEa_5, and the plurality of first touch island electrode TE1_1 aligned with each other in the first direction x may be disposed to be shifted upward in the second direction y from the plurality of first touch island electrode TE1 aligned with each other in the first direction X.

Similarly, the connection electrodes CE_1 for connecting the first touch island electrode TEI_1 and the first touch electrodes TE and TEa_5 adjacent thereto may be disposed to be shifted upward in the second direction y from the connection electrodes CE adjacent to each other in the first direction x, respectively. That is, the connection electrode CE_1 for connecting the first touch electrode TE and the first touch island electrode TEI_1 may be disposed upward in the second direction y from the connection electrode CE for connecting the first touch electrode TEa_5 and the first touch island electrode TEI adjacent to each other in the first direction x, and the connection electrode CE_1 for connecting the first touch electrode TEa_5 and the first touch island electrode TEI_1 may be disposed upward in the second direction y from the connection electrode CE for connecting the first touch electrode TE and the first touch island electrode TEI adjacent to each other in the first direction x.

The connection portion CP_1 for connecting the adjacent second touch electrodes RE and REa_4 may also be disposed upward in the second direction y from the connection portion CP adjacent in the first direction x.

In some exemplary embodiments, the touch electrodes TE, TEa_5, RE, and REa_4 may be formed in the mesh pattern described above with reference to FIG. 29.

Figure 33:
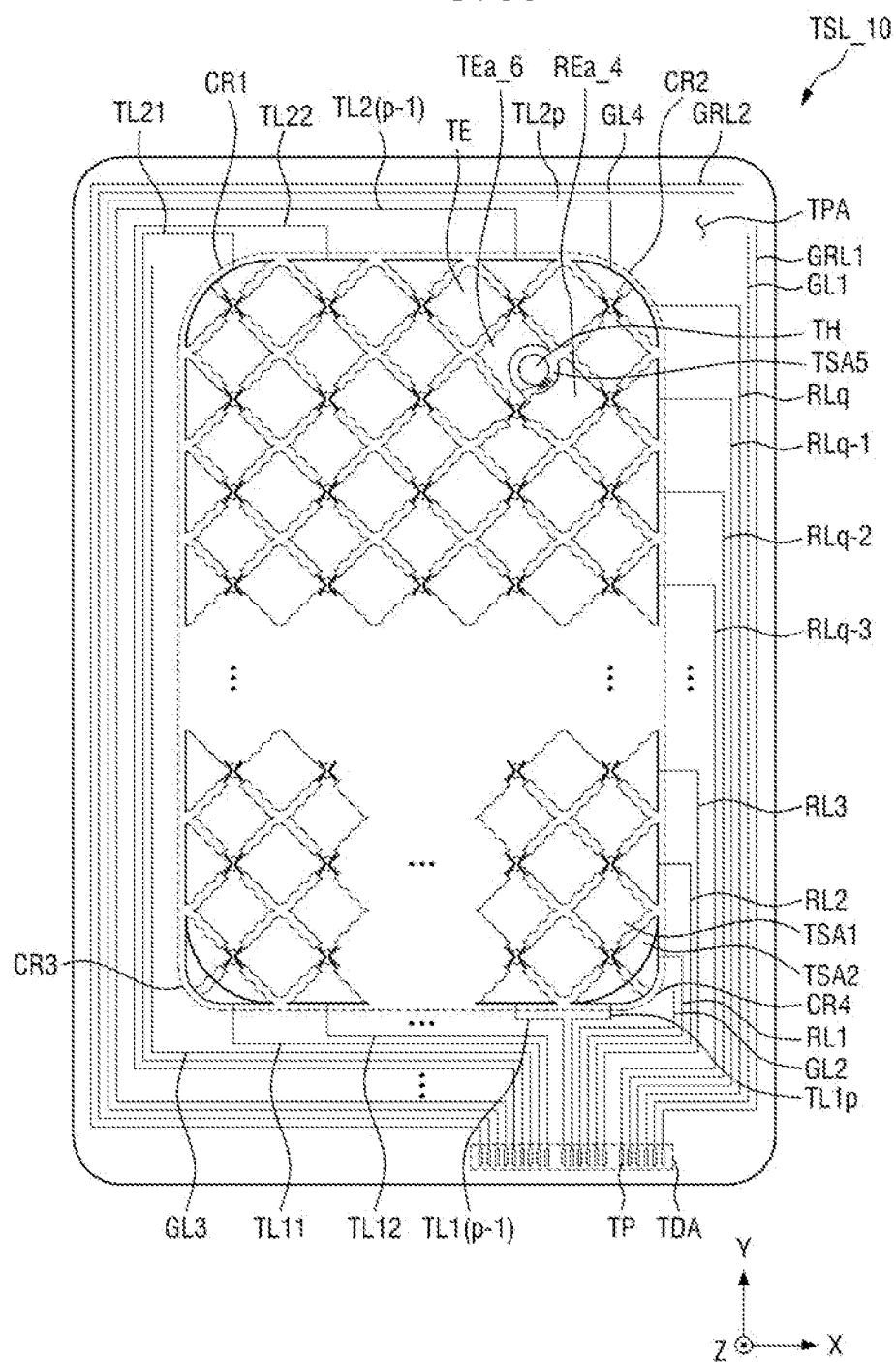
FIG. 33 is a plan view of a touch sensing unit according to still another exemplary embodiment of the invention.
Figure 34:
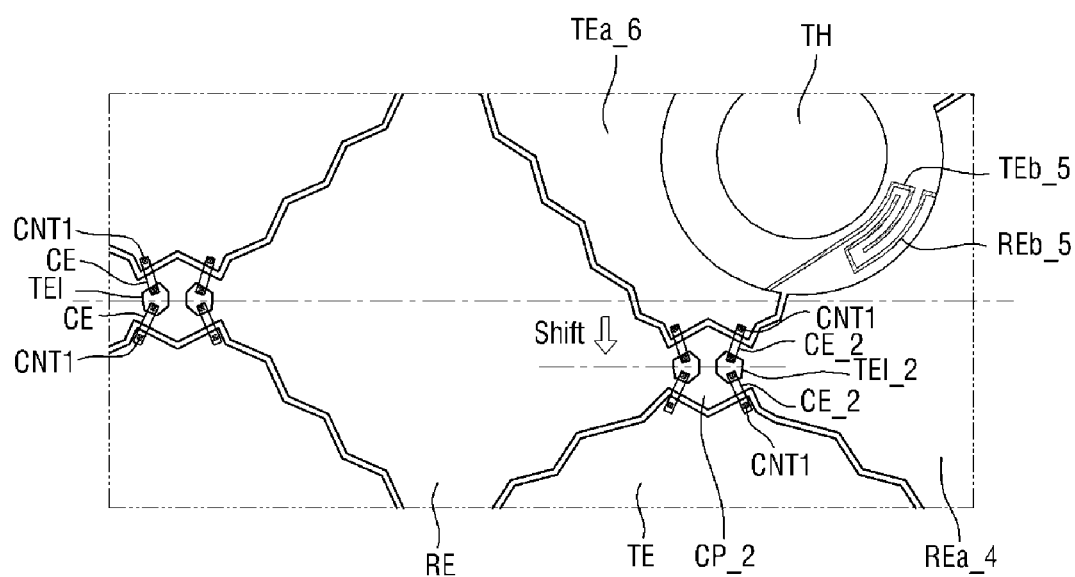
FIG. 34 is an enlarged plan view of a part of FIG. 33.

FIG. 33 is a plan view of a touch sensing unit according to still another embodiment, and FIG. 34 is an enlarged plan view of a part of FIG. 31.

Referring to FIGS. 33 and 34, A touch sensor layer TSL 10 according to the present exemplary embodiment in which the through-hole TH is disposed between the first touch electrode TEa_6 and the second touch electrode REa_4, each having a cut shape in a plan view, is different from the touch sensor layer TSL_7 of FIGS. 25 and 26 in which the though hole TH is disposed between the first touch electrodes TEa_4 adjacent to each other along the second direction y and between the second touch electrodes REa_4 adjacent to each other along the first direction x. As shown in FIG. 33, the through-hole TH according to the present exemplary embodiment may be disposed between one first touch electrode TEa_6 and one second touch electrode REa_4, and may not be disposed adjacent to the touch electrodes TE and RE other than the one first touch electrode TEa_6 and the one second touch electrode REa_4.

That is, the through-hole TH of the touch sensor layer TSL 10 may be disposed between the first touch electrode TEa_6 and the second touch electrode REa_4 in a plan view, and may not be disposed between the first touch electrodes TEa_6 and TE adjacent to each other along the second direction y and between the second touch electrodes REa_4 and RE adjacent to each other along the first direction x in a plan view. Thus, connection electrodes for electrically connecting the adjacent first touch electrodes TEa_4 to the adjacent second touch electrodes REa_4, having been described with reference to FIGS. 25 and 26, may be omitted.

The through-hole TH according to the present exemplary embodiment may be adjacent to an edge side of the lower right end of the rhombic first touch electrode TEa_6 and an edge side of the upper left end of the rhombic second touch electrode REa_4. The through-hole TH may be disposed between the edge side of the lower right end of the first touch electrode TEa_6 and the edge side of the upper left end of the second touch electrode REa_4.

The fifth touch sensor area TSA5 may surround the through-hole TH in a plan view. Similarly, the fifth touch sensor area TSA5 may be disposed adjacent to an edge side of the lower right end of the rhombic first touch electrode TEa_6 and an edge side of the upper left end of the rhombic second touch electrode REa_4. Further, the fifth touch sensor area TSA5 may be disposed between the edge side of the lower right end of the first touch electrode TEa_6 and the edge side of the upper left end of the second touch electrode REa_4 in a plan view.

As described above with reference to FIG. 6, the first touch electrodes TE disposed adjacent to each other along the second direction y may be electrically connected to each other through the first touch island electrode TE1 and the connection electrode CE for connecting the first touch electrode TE and the first touch island electrode TE.

Even in FIGS. 33 and 34, similarly, the first touch electrodes TE and TEa_6 disposed adjacent to each other along the second direction y may be electrically connected to each other through a first touch island electrode TE1_2 and a connection electrode CE_2 for connecting the first touch electrodes TE and TEa_6 and the first touch island electrode TE_1. Since the first touch island electrode TE1_2 and the connection electrode CE_2 to be additionally described is the same as the first touch island electrode TE1 and the connection electrode CE having been described with reference to FIG. 6 in terms of function and layout relationship with the adjacent first touch electrodes TE and TEa_6, a redundant description will be omitted.

In order for the first touch island electrode TE1_2 and the connection electrode CE_2 to interfere with the through-hole disposed adjacent to an edge side of the lower right end of the rhombic first touch electrode TEa_6, the first touch island electrode TE1_2 and the connection electrode CE_2 may be disposed to be shifted in the second direction y from the first touch island electrode TE1 and the connection electrode CE adjacent to each other in the first direction x. That is, as shown in FIG. 34, the first touch island electrode TE1_2 disposed between the first touch electrodes TE and TEa_6 may be disposed below the first touch island electrode TE1 disposed between the first touch electrodes TE adjacent to each other along the second direction y. As described above with reference to FIG. 6, a plurality of first touch island electrode TE1_2 may be disposed between the first touch electrodes TE and TEa_6, and the plurality of first touch island electrode TE1_2 aligned with each other in the first direction x may be disposed to be shifted downward in the second direction y from the plurality of first touch island electrode TE1 aligned with each other in the first direction x.

Similarly, the connection electrodes CE_2 for connecting the first touch island electrode TEI_2 and the first touch electrodes TE and TEa_6 adjacent thereto may be disposed to be shifted downward in the second direction y from the connection electrodes CE adjacent to each other in the first direction x, respectively. That is, the connection electrode CE_2 for connecting the first touch electrode TE and the first touch island electrode TEI_2 may be disposed downward in the second direction y from the connection electrode CE for connecting the first touch electrode TE and the first touch island electrode TEI adjacent to each other in the first direction x, and the connection electrode CE_2 for connecting the first touch electrode TEa_6 and the first touch island electrode TEI_2 may be disposed downward in the second direction y from the connection electrode CE for connecting the first touch electrode TE and the first touch island electrode TEI adjacent to each other in the first direction x.

The connection portion CP_2 for connecting the adjacent second touch electrodes RE and REa_4 may also be disposed downward in the second direction y from the connection portion CP adjacent in the first direction x.

In some exemplary embodiments, the touch electrodes TE, TEa_6, RE, and REa_4 may be formed in the mesh pattern described above with reference to FIG. 29.

According to the touch sensing unit and the display device including the same according to inventive concepts, it is possible to prevent a decrease in touch detection power due to a decrease in sensing area of the touch sensing unit.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a display unit comprising a display area, a first non-display area outside the display area, and a second non-display area inside the display area;
    a touch unit on the display unit and comprising a capacitance compensation pattern that overlaps the second non-display area;
    a first through hole penetrating the display unit and the touch unit, the first through hole being disposed inside the second non-display area to be surrounded by the second non-display area; and
    a sealing member overlapping at least the second non-display area and surrounding the first through hole completely,
    wherein:
        the display unit comprises a first substrate, a second substrate facing the first substrate, and a light emitting layer between the first substrate and the second substrate; and
        the first through hole penetrates all of the first substrate, the light emitting layer, and the second substrate.

2. The display device of claim 1, wherein the sealing member is configured to block spatial connection between the display area of the display unit and an inner space of the first through hole.

3. A display device, comprising:
    a display unit comprising a display area, a first non-display area outside the display area, and a second non-display area inside the display area;
    a touch unit on the display unit and comprising a capacitance compensation pattern having a curved shape and overlapping the second non-display area;
    a first through hole penetrating the display unit and the touch unit, the first through hole being disposed inside the second non-display area to be surrounded by the second non-display area; and
    a sealing member overlapping at least the second non-display area and surrounding the first through hole completely,
    wherein:
        the display unit comprises a first substrate and a light emitting layer on the first substrate; and
        the first through hole penetrates all of the first substrate and the light emitting layer.

4. The display device of claim 3, wherein the sealing member further covers the light emitting layer.

5. A display device, comprising:
    a display unit comprising a display area, a first non-display area outside the display area, and a second non-display area inside the display area;
    a first through hole penetrating the display unit, the first through hole being disposed inside the second non-display area to be surrounded by the second non-display area;
    a sealing member overlapping at least the second non-display area and surrounding the first through hole completely;
    a touch unit on the display unit; and
    a second through hole penetrating the touch unit, the second through hole overlapping and physically connected to the first through hole,
    wherein:
        the touch unit comprises a plurality of touch electrodes and a capacitance compensation pattern connected to at least one of the plurality of touch electrodes; and
        the capacitance compensation pattern overlaps the second non-display area.

6. The display device of claim 5, wherein the capacitance compensation pattern are bent two or more times in a region overlapping the second non-display area.

7. The display device of claim 5, wherein:
    the plurality of touch electrodes comprise a first touch electrode adjacent the second through hole and a second touch electrode spaced apart from the second through hole; and
    an area of the first touch electrode is smaller than an area of the second touch electrode.

8. The display device of claim 7, wherein the first touch electrode is connected to the capacitance compensation pattern.

* * * * *